US012041786B2

(12) United States Patent
Young et al.

(10) Patent No.: US 12,041,786 B2
(45) Date of Patent: *Jul. 16, 2024

(54) FERROELECTRIC RANDOM ACCESS MEMORY DEVICE WITH A THREE-DIMENSIONAL FERROELECTRIC CAPACITOR

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Han-Jong Chia, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,650

(22) Filed: Sep. 20, 2022

(65) Prior Publication Data

US 2023/0015093 A1 Jan. 19, 2023

Related U.S. Application Data

(63) Continuation of application No. 16/868,922, filed on May 7, 2020, now Pat. No. 11,450,676.

(Continued)

(51) Int. Cl.
*H01L 27/11507* (2017.01)
*H01L 29/66* (2006.01)
(Continued)

(52) U.S. Cl.
CPC ............ *H10B 53/30* (2023.02); *H01L 28/60* (2013.01); *H01L 29/66795* (2013.01); *H01L 29/7851* (2013.01)

(58) Field of Classification Search
CPC ...... H01L 21/823431; H01L 21/823821; H01L 21/845; H01L 27/0886; H01L 27/0924; H01L 27/10879; H01L 27/1211; H01L 28/40; H01L 28/60; H01L 28/86; H01L 28/90; H01L 29/40111; H01L 29/41791; H01L 29/66795; H01L 29/785; H01L 29/7851; H01L 29/7853; H01L 29/7855; H01L 2029/7858; H10B 53/30
See application file for complete search history.

(56) References Cited

U.S. PATENT DOCUMENTS 6,512,259 B1 1/2003 Lange et al.
6,706,607 B2 3/2004 Park et al.
(Continued)

FOREIGN PATENT DOCUMENTS

KR 20070112603 A 11/2007
KR 20120022106 A 3/2012
(Continued)

*Primary Examiner* — David C Spalla
(74) *Attorney, Agent, or Firm* — Slater Matsil, LLP

(57) ABSTRACT

A semiconductor device includes a substrate, a fin protruding over the substrate, a gate structure over the fin, a bottom electrode over and electrically coupled to the gate structure, a ferroelectric layer around the bottom electrode, and a top electrode around the ferroelectric layer.

20 Claims, 26 Drawing Sheets

Related U.S. Application Data

(60) Provisional application No. 62/982,361, filed on Feb. 27, 2020.

(51) Int. Cl.
    *H01L 29/78*     (2006.01)
    *H01L 49/02*     (2006.01)
    *H10B 53/30*     (2023.01)

(56) References Cited

U.S. PATENT DOCUMENTS

| | | |
|---|---|---|
| 11,450,676 B2 * | 9/2022 | Young .............. H01L 29/66795 |
| 2006/0001070 A1 * | 1/2006 | Park .................... H01L 28/91 |
| | | 257/295 |
| 2006/0072281 A1 | 4/2006 | Nam et al. |
| 2007/0267705 A1 | 11/2007 | Won et al. |
| 2008/0001250 A1 * | 1/2008 | Ichimura .............. H10B 12/033 |
| | | 257/529 |
| 2012/0052648 A1 | 3/2012 | Kwon et al. |
| 2014/0264517 A1 | 9/2014 | Kim et al. |
| 2018/0006044 A1 * | 1/2018 | Chavan ................. H10B 53/30 |
| 2018/0226417 A1 | 8/2018 | Ando et al. |
| 2018/0323309 A1 | 11/2018 | Ando et al. |
| 2020/0013871 A1 | 1/2020 | An et al. |

FOREIGN PATENT DOCUMENTS

| | | |
|---|---|---|
| KR | 20180003666 A | 1/2018 |
| KR | 20200010974 A | 1/2020 |
| TW | 469598 B | 12/2001 |
| TW | 200400616 A | 1/2004 |
| WO | 2018125024 A1 | 7/2018 |

* cited by examiner

FERROELECTRIC RANDOM ACCESS MEMORY DEVICE WITH A THREE-DIMENSIONAL FERROELECTRIC CAPACITOR

PRIORITY CLAM AND CROSS-REFERENCE

This application is a continuation of U.S. patent application Ser. No. 16/868,922, filed May 7, 2020, entitled "Ferroelectric Random Access Memory Device with a Three-Dimensional Ferroelectric Capacitor," which claims the benefit of U.S. Provisional Application No. 62/982,361, filed on Feb. 27, 2020 and entitled "Ferroelectric Random Access Memory (FRAM) Device with a Three-Dimensional Ferroelectric Capacitor," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin field-effect transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

Ferroelectric random access memory (FeRAM, or FRAM) is a candidate for next generation non-volatile memory, due to its fast write/read speed and small size. In the one-transistor one-capacitor (1T-1C) FRAM structure, the FRAM memory cell with the ferroelectric (FE) capacitor is typically integrated in the back end of line (BEOL) processing. The existing FRAM structure has limited capacitance tuning capability. There is a need in the art for FRAM structures that could achieve high capacitance tuning capability and high integration density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same numeral in different figures refers to the same or similar component formed by a same or similar method using a same or similar material(s).

Embodiments of the present disclosure are discussed in the context of forming a FinFET device, and in particular, in the context of forming 1T-1C FRAM devices with ferroelectric capacitors having a three-dimensional structure. Although the disclosed embodiments are discussed using FinFET devices as examples, the disclosed methods may also be used in other types of devices, such as planar devices.

In some embodiments, a 1T-1C FRAM memory cell includes a FinFET and a three-dimensional ferroelectric capacitor. The three-dimensional ferroelectric capacitor includes a bottom electrode electrically coupled to the gate of the FinFET in the 1T-1C memory cell. The bottom electrode is a conductive column (or conductive pillar) over the FinFET. The three-dimensional ferroelectric capacitor further includes a ferroelectric layer around the bottom electrode, and a top electrode around the ferroelectric layer. The capacitance of the three-dimensional ferroelectric capacitor may be adjusted by adjusting a radius of the ferroelectric capacitor or a height of the ferroelectric capacitor, thus allowing for a large tuning window for the capacitance of the ferroelectric capacitor and may advantageously increases the threshold voltage shift for the memory device formed.

Figure 1:
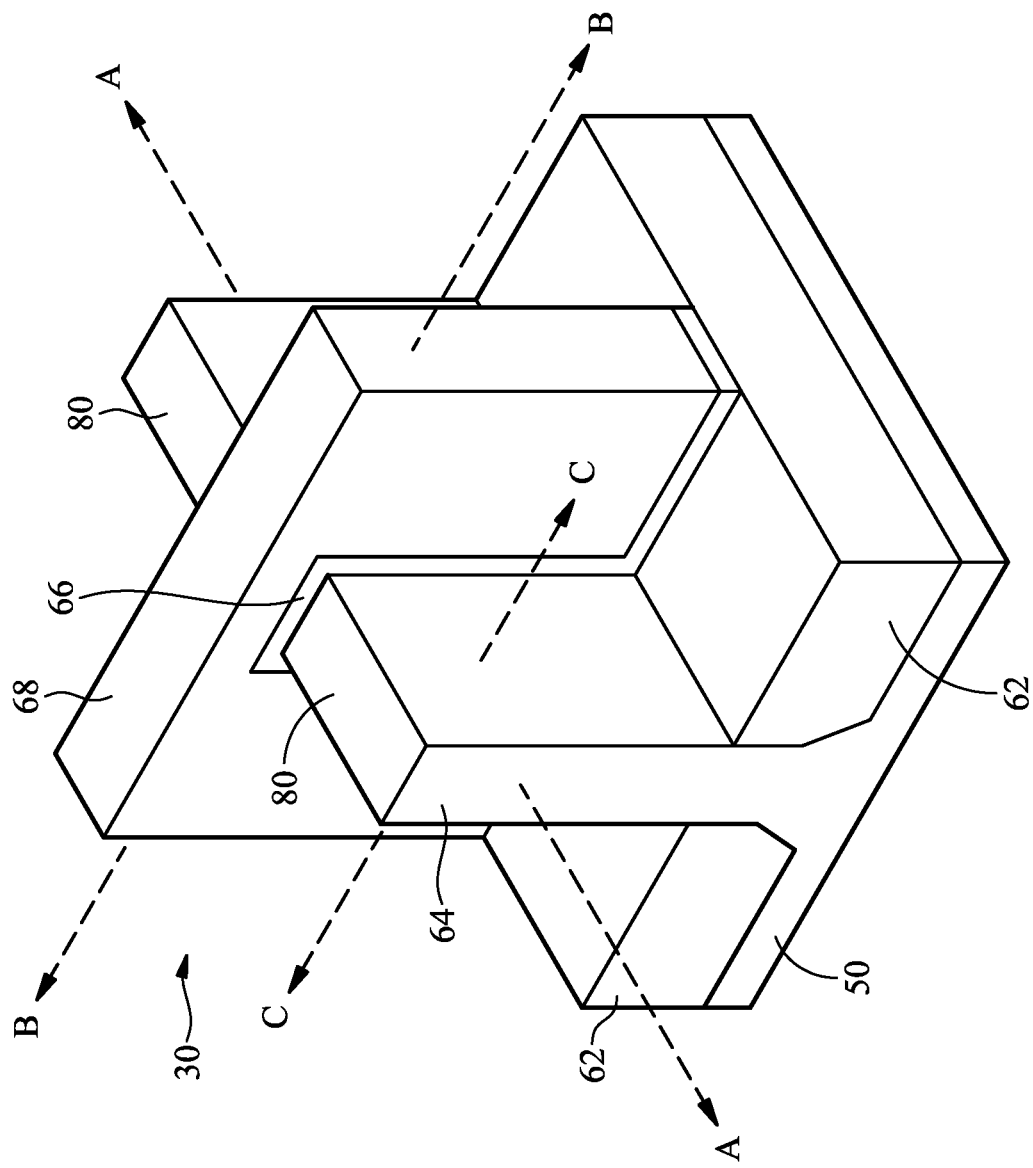
FIG. 1 illustrates a perspective view of a fin field-effect transistor (FinFET) device, in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-14 and 15A illustrate cross-sectional views of a FinFET device 100 at various stages of fabrication, in accordance with an embodiment. In the illustrated embodiment, the FinFET device 100 has the 1T-1C structure (see FIG. 14A), which 1T-1C structure includes a ferroelectric (FE) capacitor electrically coupled to a FinFET to form a memory cell (e.g., an FRAM memory cell). Therefore, the FinFET device 100 may also be referred to as an FRAM device. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6-14 and 15A illustrate cross-sectional views of the FinFET device 100 along cross-section A-A. Throughout the discussion herein, unless otherwise specified, figures with the same number but different alphabets (e.g., FIGS. 15A and 15B) refer to different cross-sectional views of a same device at a same stage of fabrication.

Figure 2:
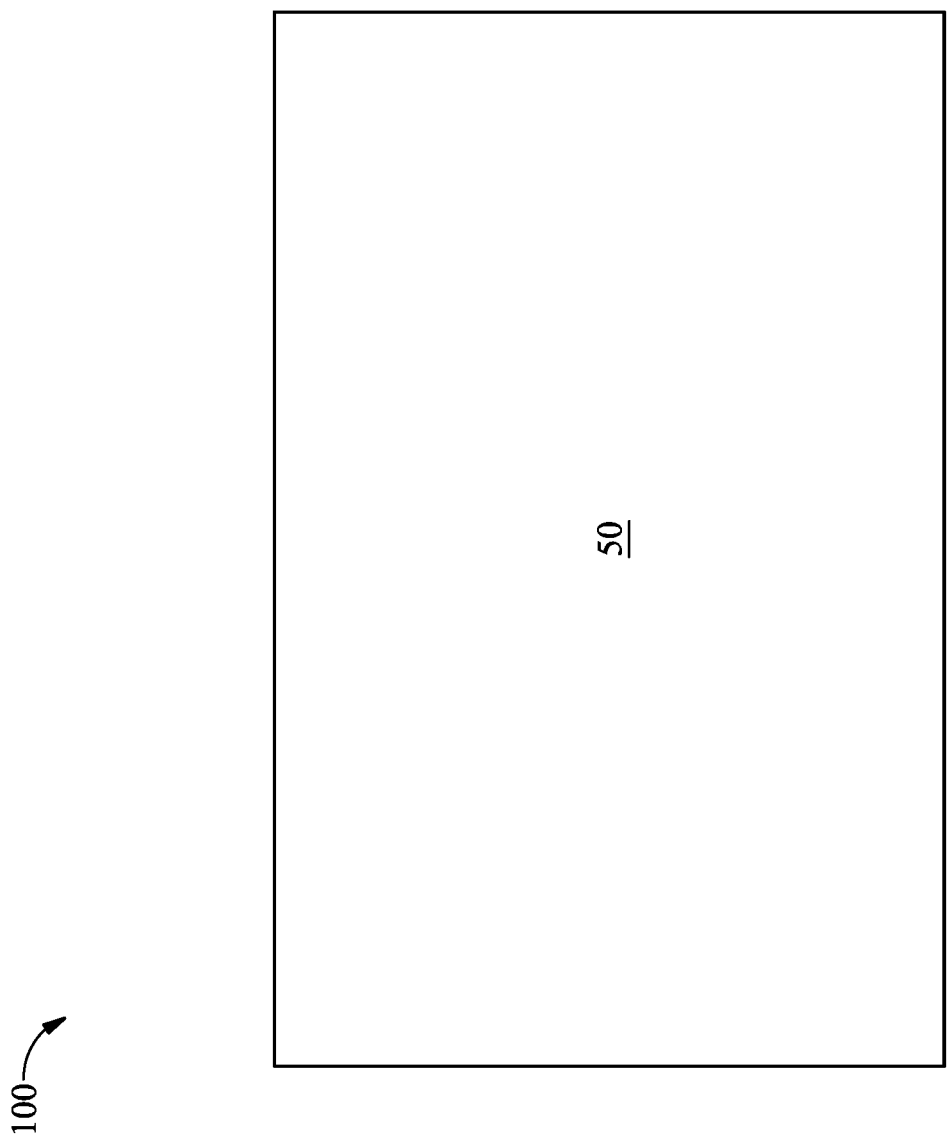
FIGS. 2-14 and 15A illustrate cross-sectional views of a FinFET device 100 at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a P-type or an N-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
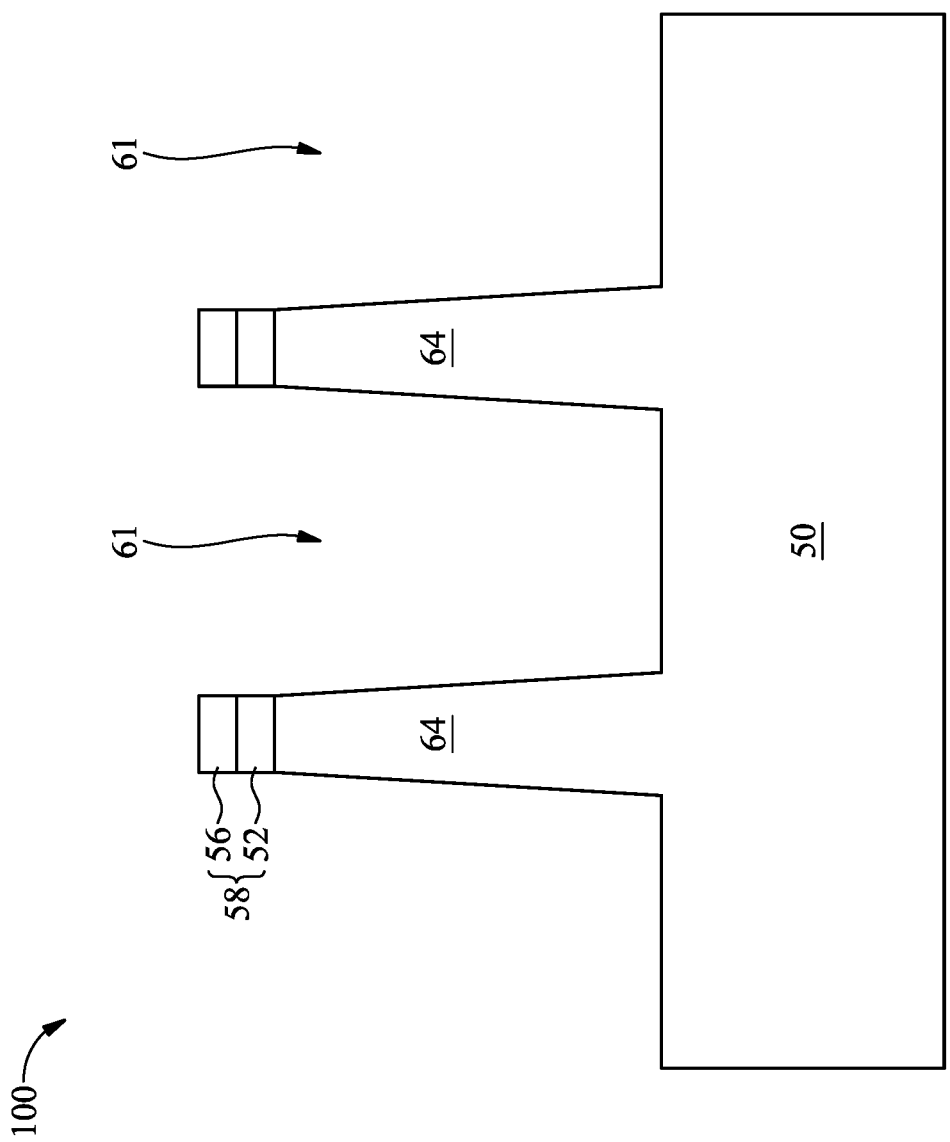

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
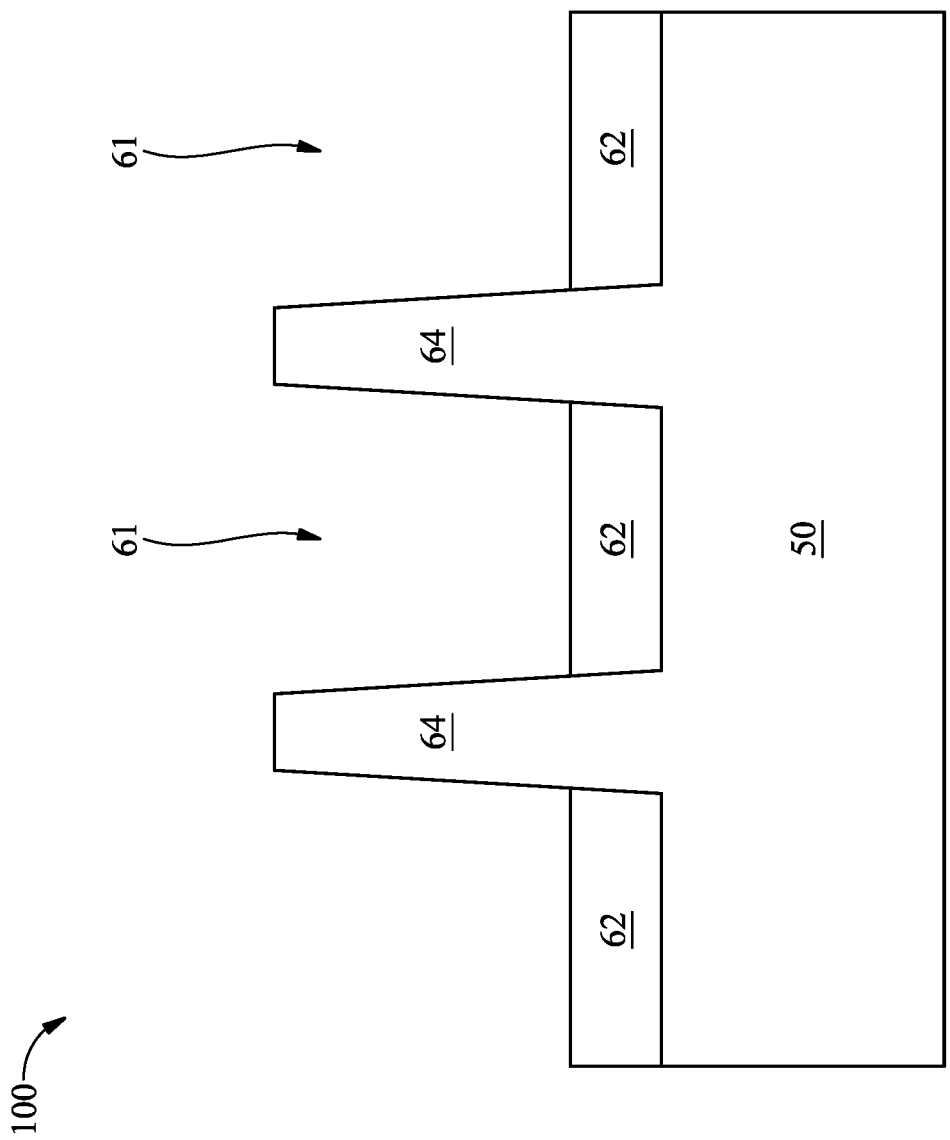

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$ where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
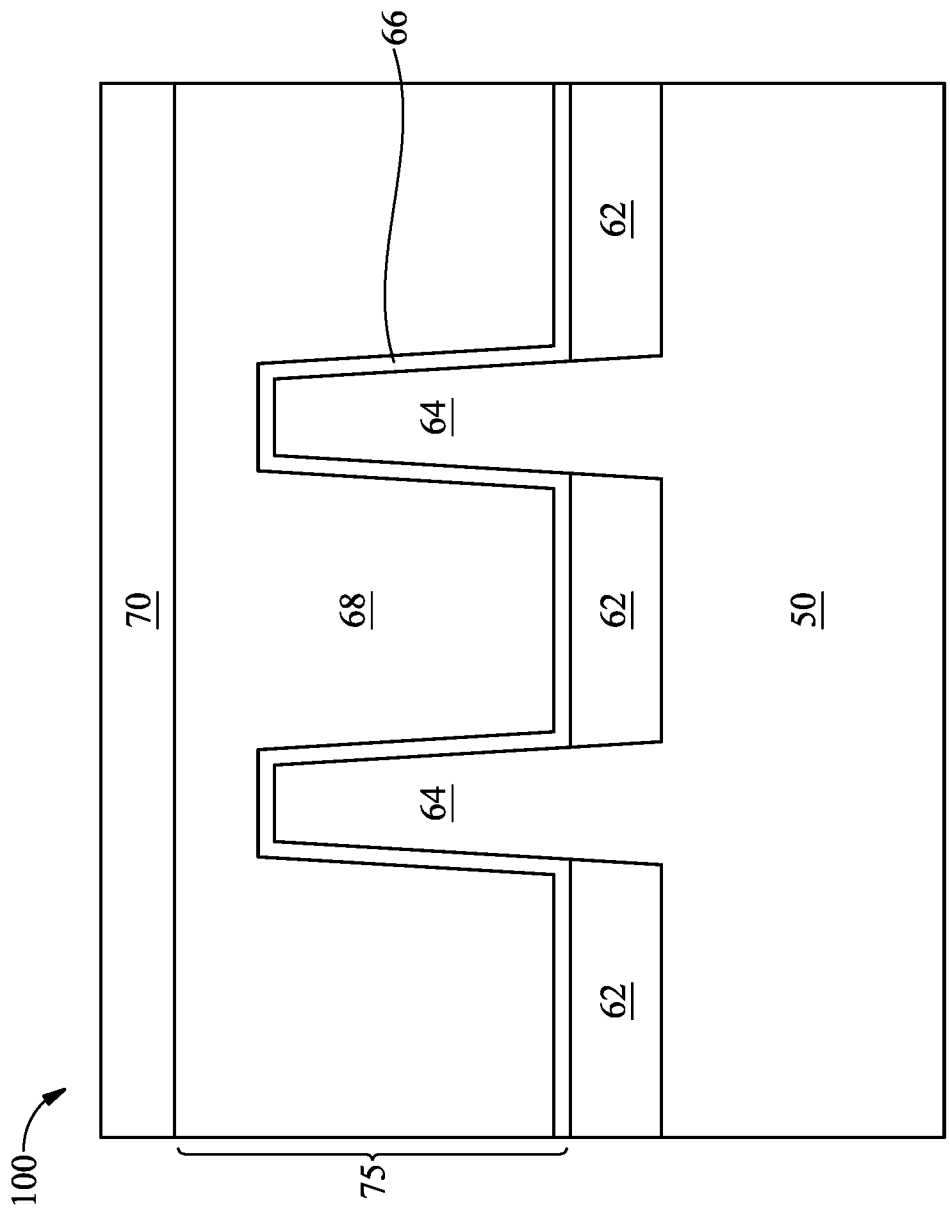

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6-14 and 15A illustrate the cross-sectional views of further processing of the FinFET device 100 along cross-section A-A (along a longitudinal axis of the fin 64). Note that in FIG. 6, two dummy gate structures 75 are formed over the fin 64. One skilled in the art will appreciate that more or less than two dummy gate structures may be formed over the fin 64, these and other variations are fully intended to be included within the scope of the present disclosure.

Figure 6:
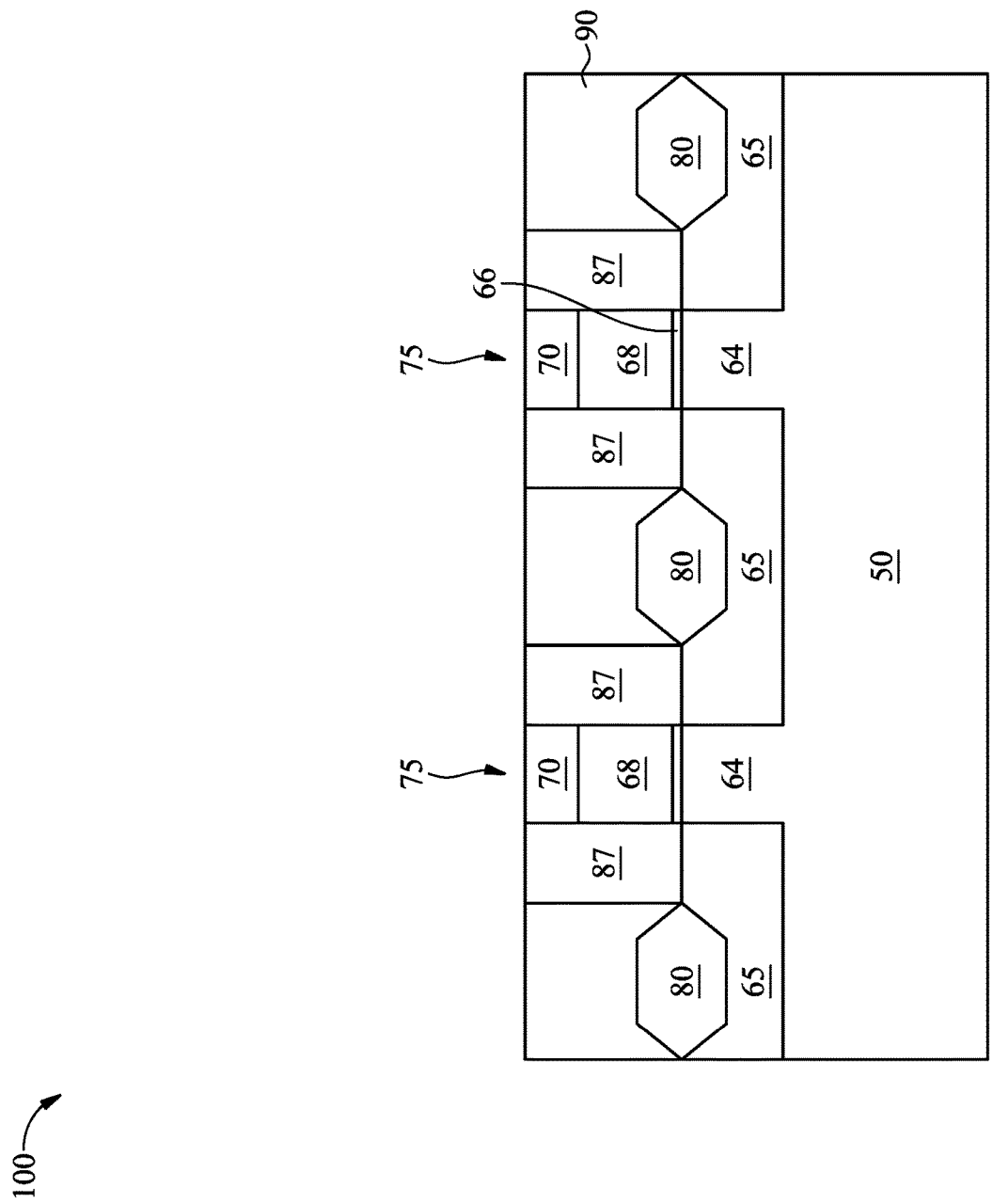

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted.

Still referring to FIG. 6, after the LDD regions 65 are formed, gate spacers 87 are formed around the dummy gate structures 75. The gate spacer 87 may include a first gate spacer and a second gate spacer (not separately illustrated). For example, the first gate spacer may be a gate seal spacer and is formed on opposing sidewalls of the gate electrode 68 and on opposing sidewalls of the gate dielectric 66. The second gate spacer is formed on the first gate spacer. The first gate spacer may be formed of a nitride, such as silicon nitride, silicon oxynitride, silicon carbonitride, the like, or a combination thereof, and may be formed using, e.g., a thermal oxidation, CVD, or other suitable deposition process. The second gate spacer may be formed of silicon nitride, silicon carbonitride, a combination thereof, or the like using a suitable deposition method.

In an embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the dummy gate structures. The second portion of the second gate spacer layer remaining after the anisotropic etch process forms the second gate spacer. The anisotropic etch process also removes a portion of the first gate spacer layer disposed outside of the sidewalls of the second gate spacer, and the remaining portion of the first gate spacer layer forms the first gate spacer.

The shapes and formation methods of the gate spacer 87 as illustrated in FIG. 6 are merely non-limiting examples, and other shapes and formation methods are possible. These and other variations are fully intended to be included within the scope of the present disclosure.

Next, as illustrated in FIG. 6, source/drain regions 80 are formed in the fins 64. To form the source/drain regions 80, recesses are formed in the fins 64 adjacent to the dummy gate structures 75, e.g., between adjacent dummy gate structures 75 and/or next to a dummy gate structure 75. The recesses are formed by, e.g., an anisotropic etching process using the dummy gate structures 75 and the gate spacers 87 as an etching mask, in some embodiments, although any other suitable etching process may also be used.

Next, the source/drain regions 80 are formed in the recesses. The source/drain regions 80 are formed by epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 6, the epitaxial source/drain regions 80 may have surfaces raised from respective surfaces of the fins 64 (e.g. raised above the non-recessed upper surface of the fins 64) and may have facets. The source/drain regions 80 of the adjacent fins 64 may merge to form a continuous epitaxial source/drain region 80. In some embodiments, the source/drain regions 80 of the adjacent fins 64 do not merge together and remain separate source/drain regions 80. In some embodiments, the resulting FinFET is an N-type FinFET, and source/drain regions 80 comprise silicon carbide (SiC), silicon phosphorous (SiP), phosphorous-doped silicon carbon (SiCP), or the like. In some embodiments, the resulting FinFET is a P-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about 1E19 cm$^{-3}$ to about 1E21 cm$^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Next, a first interlayer dielectric (ILD) 90 is formed over the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70. After the planarization process, the top surface of the first ILD 90 is level with the top surface of the gate electrode 68.

Figure 7:
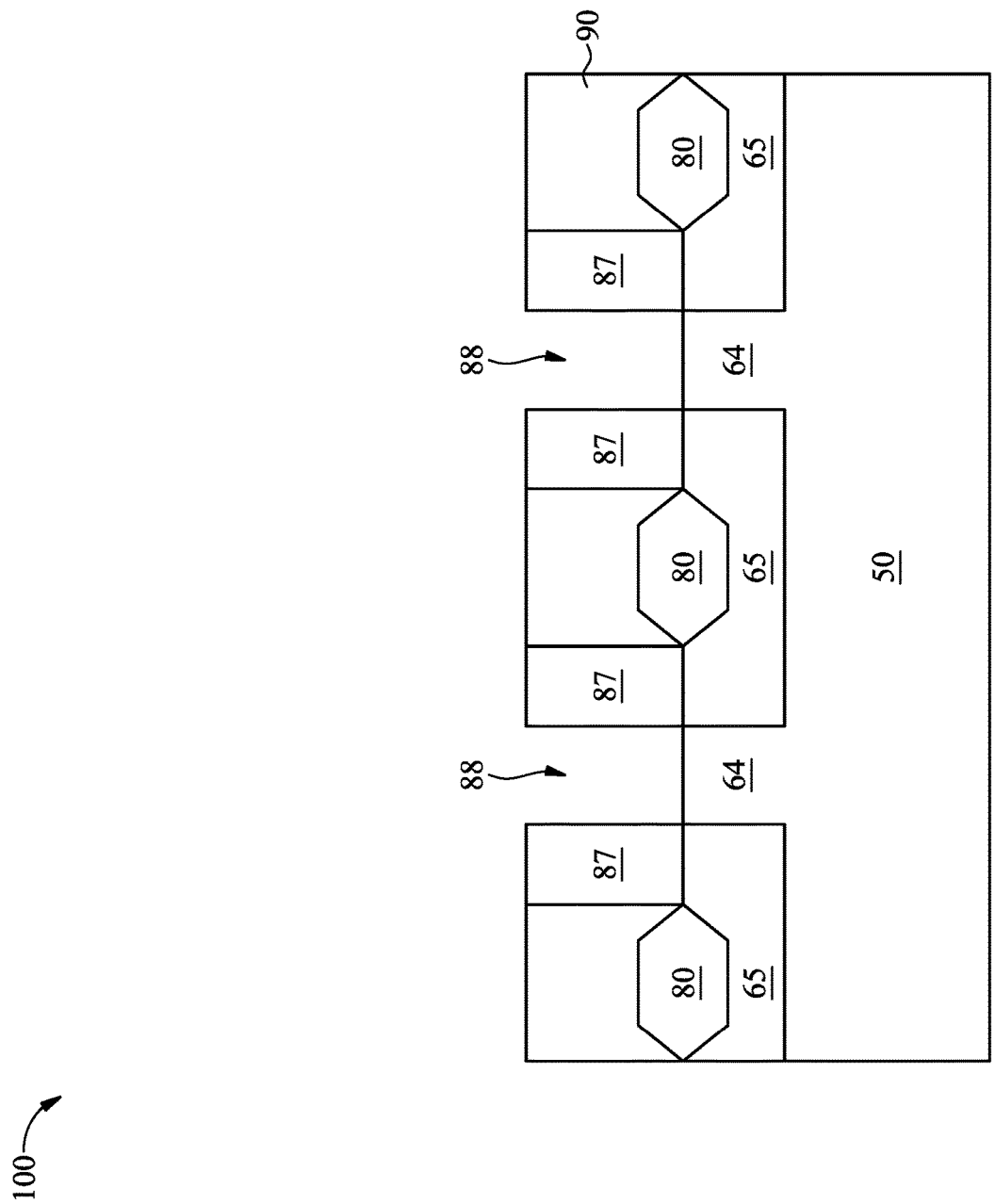
Figure 8:
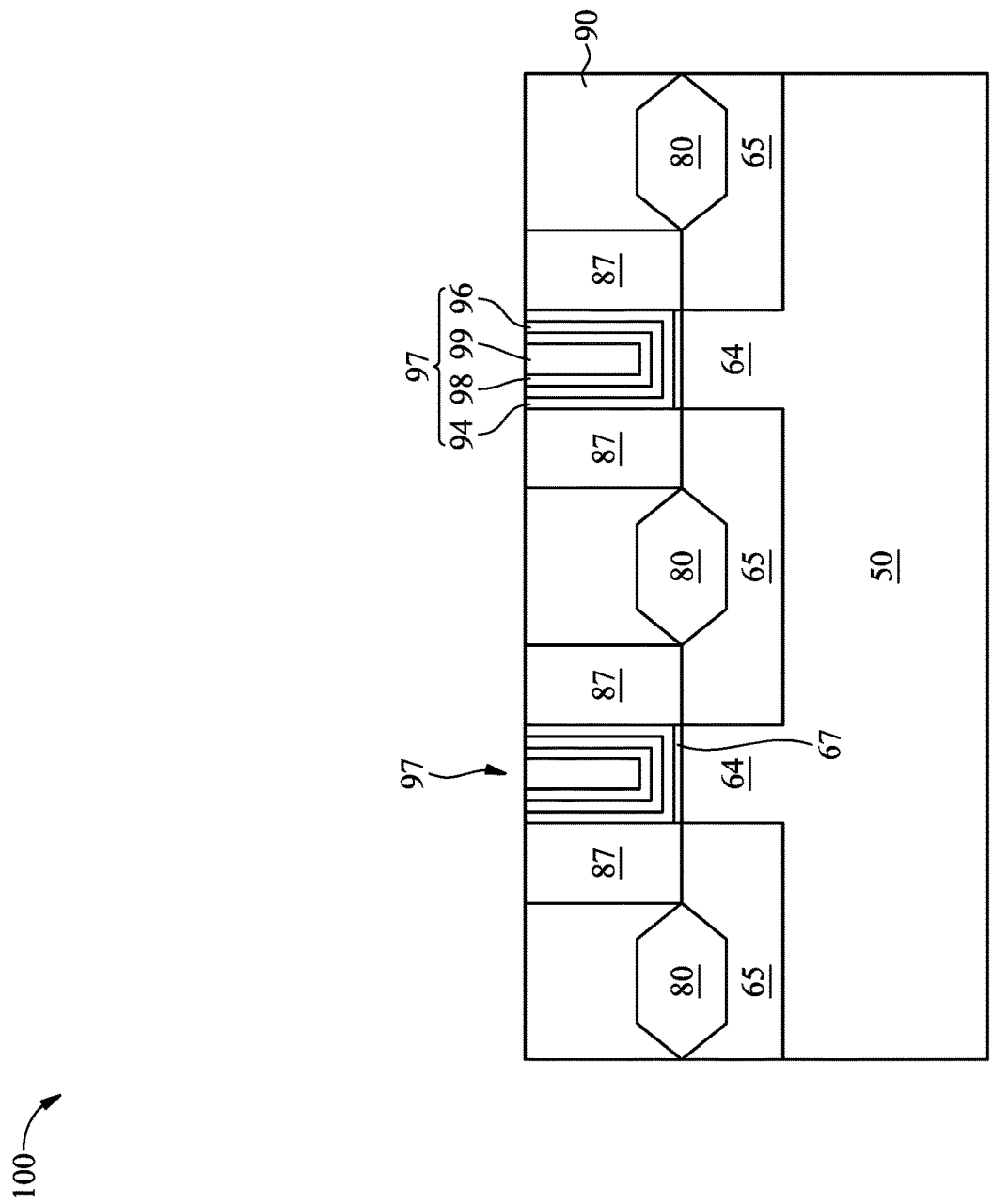

Next, in FIGS. 7-8, an embodiment gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 7, the dummy gate structures 75 are removed to form recess 88 between the gate spacers 87. In accordance with some embodiments, to remove the dummy gate structures 75, the gate electrode 68 and the gate dielectric 66 directly under the gate electrode 68 are removed in an etching step(s), so that recesses 88 are formed between the gate spacers 87. Each recess 88 exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, in FIG. 8, a gate dielectric layer 94, a barrier layer 96, a work function layer 98, and a gate electrode 99 are formed in the recesses 88 for the replacement gate structures 97 (also referred to as metal gate structure). The gate dielectric layer 94 is deposited conformally in the recesses 88, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a P-type work function layer or an N-type work function layer, may be formed in the recesses over the barrier layers 96, in some embodiments. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 99 is deposited over the seed layer, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the top surface of the first ILD 90. The resulting remaining portions of the gate dielectric layer 94, the barrier layer 96, the work function layer 98, the seed layer, and the gate electrode 99 thus form the replacement gate structures 97 of the resulting FinFET device 100.

Figure 9:
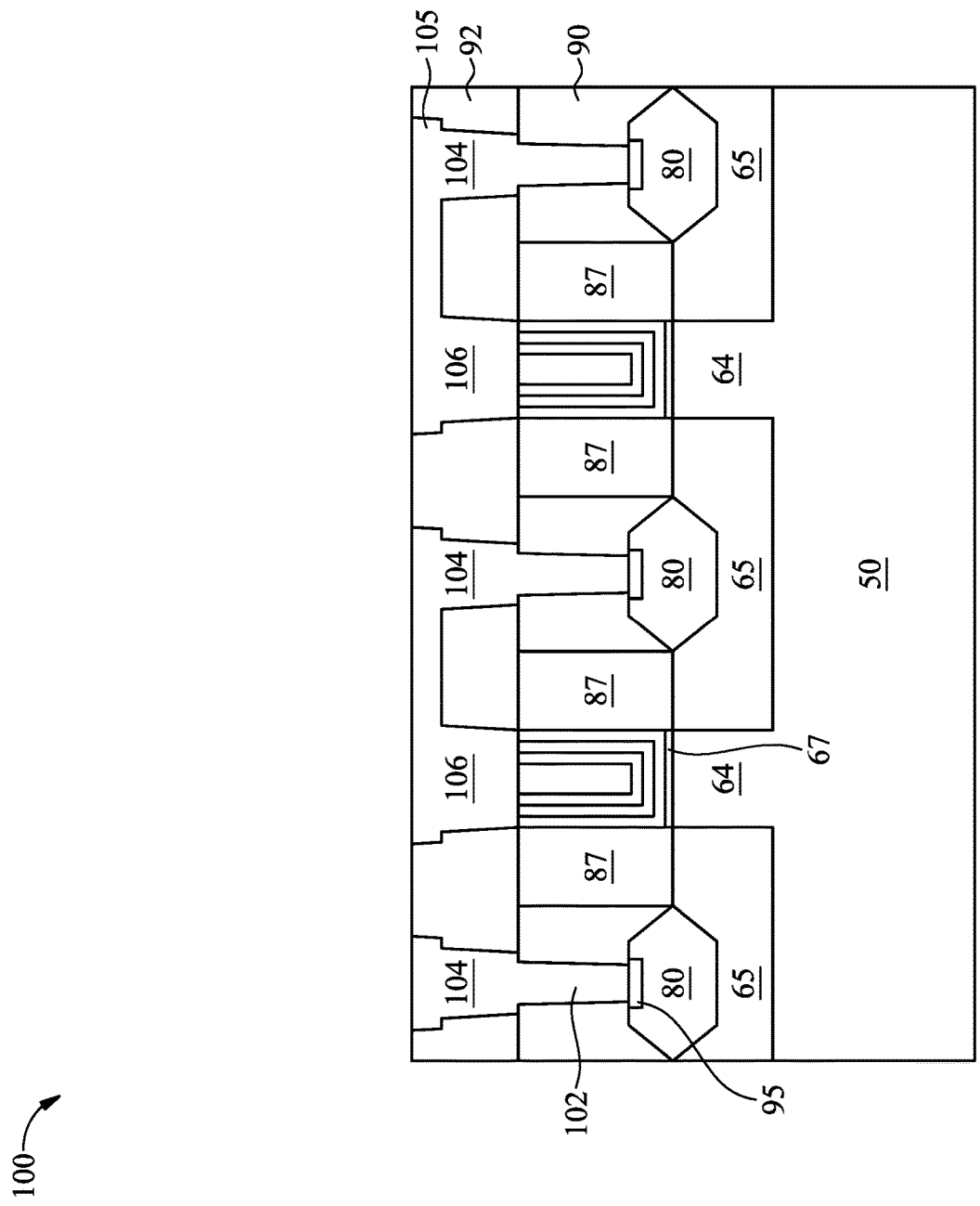

Referring next to FIG. 9, contacts 102 (also referred to as source/drain contacts) are formed in the first ILD 90 to electrically couple to respective underlying source/drain regions 80. To form the contacts 102, openings are formed through the first ILD 90 to expose the source/drain regions 80 using, e.g., photolithography and etching techniques. Next, a barrier layer (not separately illustrated) is formed (e.g., conformally) in the openings. The barrier layer may comprise an electrically conductive material such as titanium nitride, although other materials, such as tantalum nitride, titanium, tantalum, or the like, may alternatively be utilized. The barrier layer may be formed using ALD, CVD, PECVD, MOCVD, or the like. Next, an electrically conductive material is formed in the openings to fill the openings. The electrically conductive material may be a metal-containing material such as Cu, Al, W, the like, combinations thereof, or multi-layers thereof, and may be formed by, e.g., electroplating, electroless plating, or other suitable method. A planarization process, such as CMP, may be performed to remove excess portions of the layers (e.g., the barrier layer and the electrically conductive material) that are disposed over the upper surface of the first ILD 90.

In some embodiments, silicide regions 95, which are optional, are formed over the source/drain regions 80 before the barrier layer and the conductive material are formed to fill the openings. In some embodiments, the silicide regions 95 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 80, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide).

Still referring to FIG. 9, a second ILD 92 is formed over the first ILD 90. In some embodiments, the second ILD 92 is a flowable film formed by a flowable CVD method. In some embodiments, the second ILD 92 is formed of a dielectric material such as silicon oxide, PSG, BSG, BPSG, USG, or the like, and may be deposited by any suitable method, such as CVD and PECVD. Electrically conductive features, such as via 104/106 and conductive lines 105, are formed in the second ILD 92 and are electrically coupled to respective underlying conductive features (e.g., contact 102 or metal gate structure 97). The vias 104/106 and conductive lines 105 may be formed of an electrically conductive material (e.g., copper) using any suitable formation method, such as damascene or dual-damascene. The upper surfaces of the conductive lines 105 are level with, thus exposed by, the upper surface of the second ILD 92, in the illustrated embodiment.

Figure 10:
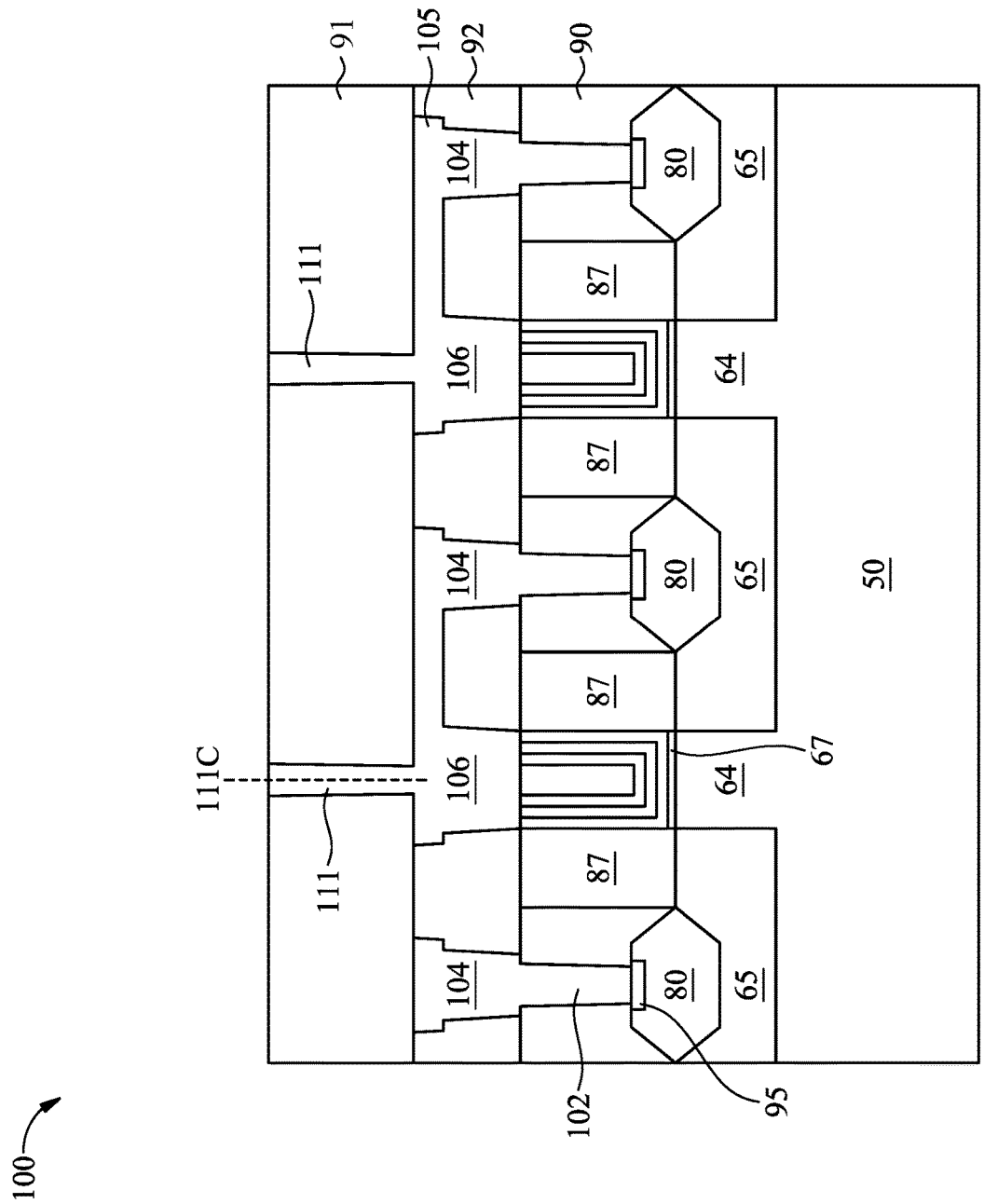

Next, referring to FIG. 10, a dummy dielectric layer 91 is formed over the second ILD 92, and vias 111 are formed in the dummy dielectric layer 91. The dummy dielectric layer 91 may be formed of, e.g., silicon oxide, and may be formed of a same material as the second ILD 92 or a different material from the second ILD 92. In some embodiments, the vias 111 are formed of an electrically conductive material, such as Cu, W, TiN, TaN, Ru, Co, or the like, using any suitable formation method. As illustrated in FIG. 10, each of the vias 111 extends through the dummy dielectric layer 91 and is electrically coupled to a metal gate structure 97 though an underlying conductive feature (e.g., via 106).

Figure 11:
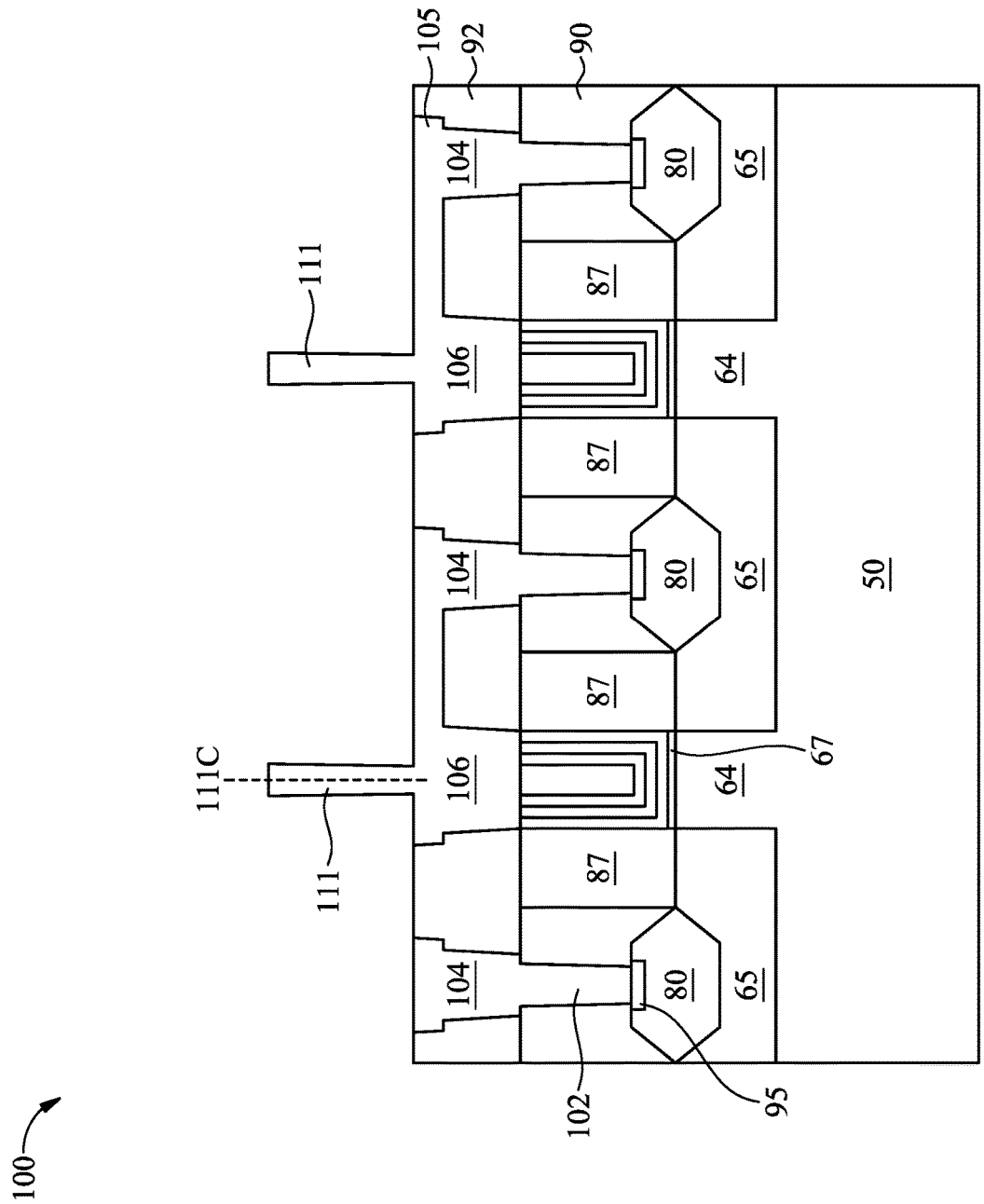

Next, in FIG. 11, the dummy dielectric layer 91 is removed, and the vias 111 are exposed as conductive columns protruding above the upper surface of the second ILD 92. The vias 111 function as the bottom electrodes of the subsequently formed ferroelectric capacitors, and therefore, may also be referred to as the bottom electrodes 111 of the ferroelectric capacitors. In the illustrated embodiment, each of the bottom electrodes 111 has a longitudinal axis 111C that extends substantially perpendicular to an upper surface (e.g., a major upper surface) of the substrate 50.

In some embodiments, the dummy dielectric layer 91 (e.g., a silicon oxide layer) is removed by an etching process. For example, a dry etch process using a gas source comprising hydrogen fluoride (HF), nitrogen trifluoride ($NF_3$), and fluorine ($F_2$) may be used to selectively remove the dummy dielectric layer 91, and the vias 111 remain as the bottom electrodes of the subsequently formed ferroelectric capacitors.

Figure 12:
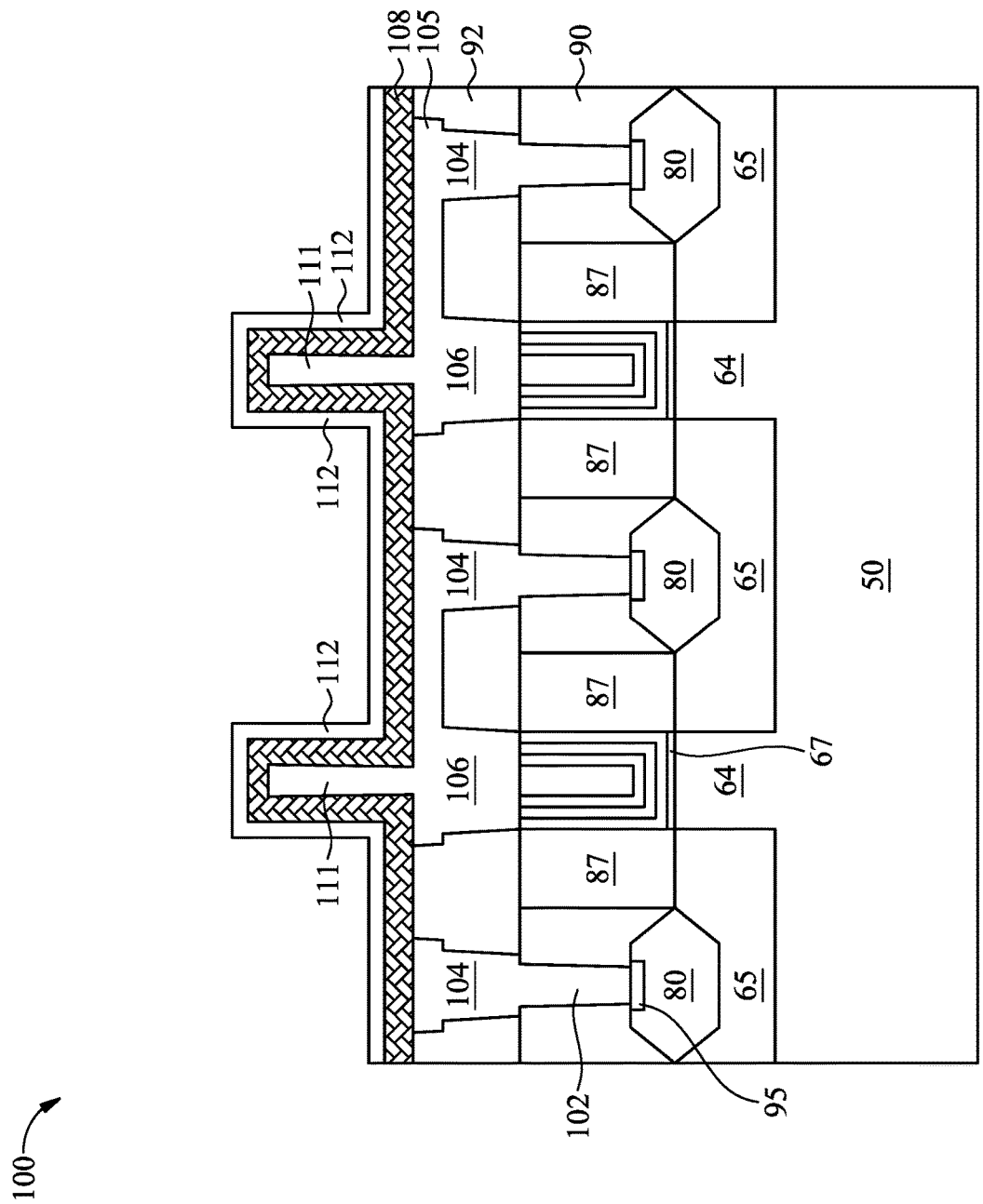

Next, in FIG. 12, a ferroelectric layer 108 is formed (e.g., conformally) over the upper surface of the second ILD 92 and over the bottom electrodes 111. The ferroelectric layer 108 comprises $HfO_2$, $HfZrO_2$, $ZrO_2$, or $HfO_2$ doped by La, Y, Si, or Ge, in some embodiments. A thickness of the ferroelectric layer 108 may be between about 3 nm and about 20 nm. Any suitable formation method, such as ALD, CVD, PVD, or the like, may be used to form the ferroelectric layer 108.

Next, a top electrode layer 112 is formed (e.g., conformally) over the ferroelectric layer 108. In some embodiments, the top electrode layer 112 comprises an electrically conductive material such as Cu, W, TiN, TaN, Ru, Co, or the like, and is formed using any suitable formation method. A thickness of the top electrode layer 112 is between about 3 nm and about 20 nm, in some embodiments.

Figure 13:
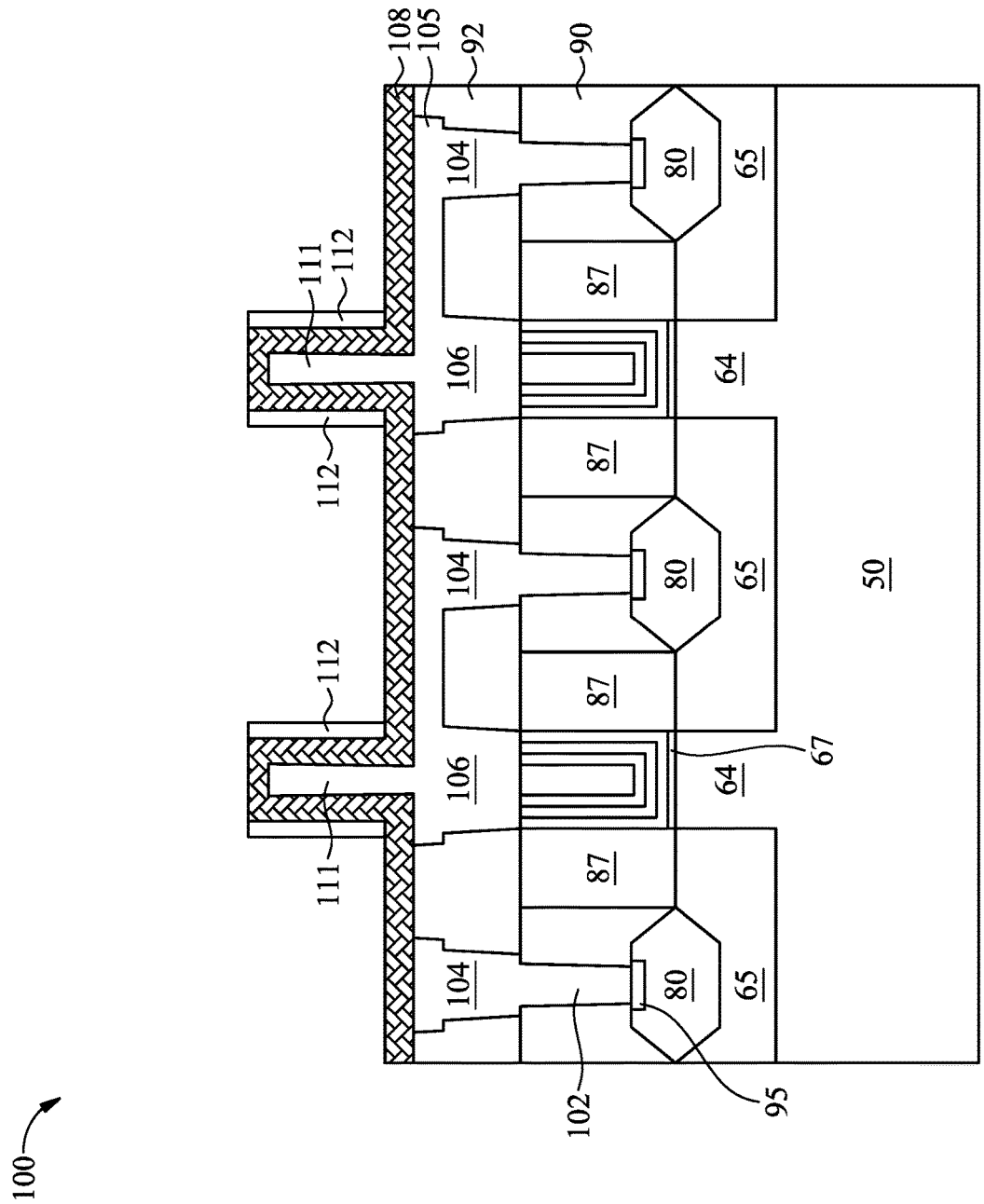

Referring next to FIG. 13, an anisotropic etching process is performed to remove horizontal portions of the top electrode layer 112, such as portions along the upper surface of the ferroelectric layer 108 facing away from the substrate. Remaining portions of the top electrode layer 112 along sidewalls of the ferroelectric layer 108 (or along sidewalls of the bottom electrode 111) form part of the top electrode (see, e.g., 113 in FIG. 15E). The anisotropic etching process may be a plasma etching process performed using a gas source comprising chlorine ($Cl_2$) and argon (Ar), as an example. The anisotropic etching process may be controlled to stop after the horizontal portions of the top electrode layer 112 are removed and the ferroelectric layer 108 is exposed.

In the example of FIG. 13, the bottom electrode 111 has a three-dimensional structure (e.g., a metal column protruding above the second ILD 92). The ferroelectric layer 108 surrounds the bottom electrode 111, e.g., extending along and contacting the sidewalls of the bottom electrode 111. The remaining portion of the top electrode layer 112 surrounds (portions of) the ferroelectric layer 108, e.g., extending along and contacting the sidewalls of the ferroelectric layer 108.

Figure 14:
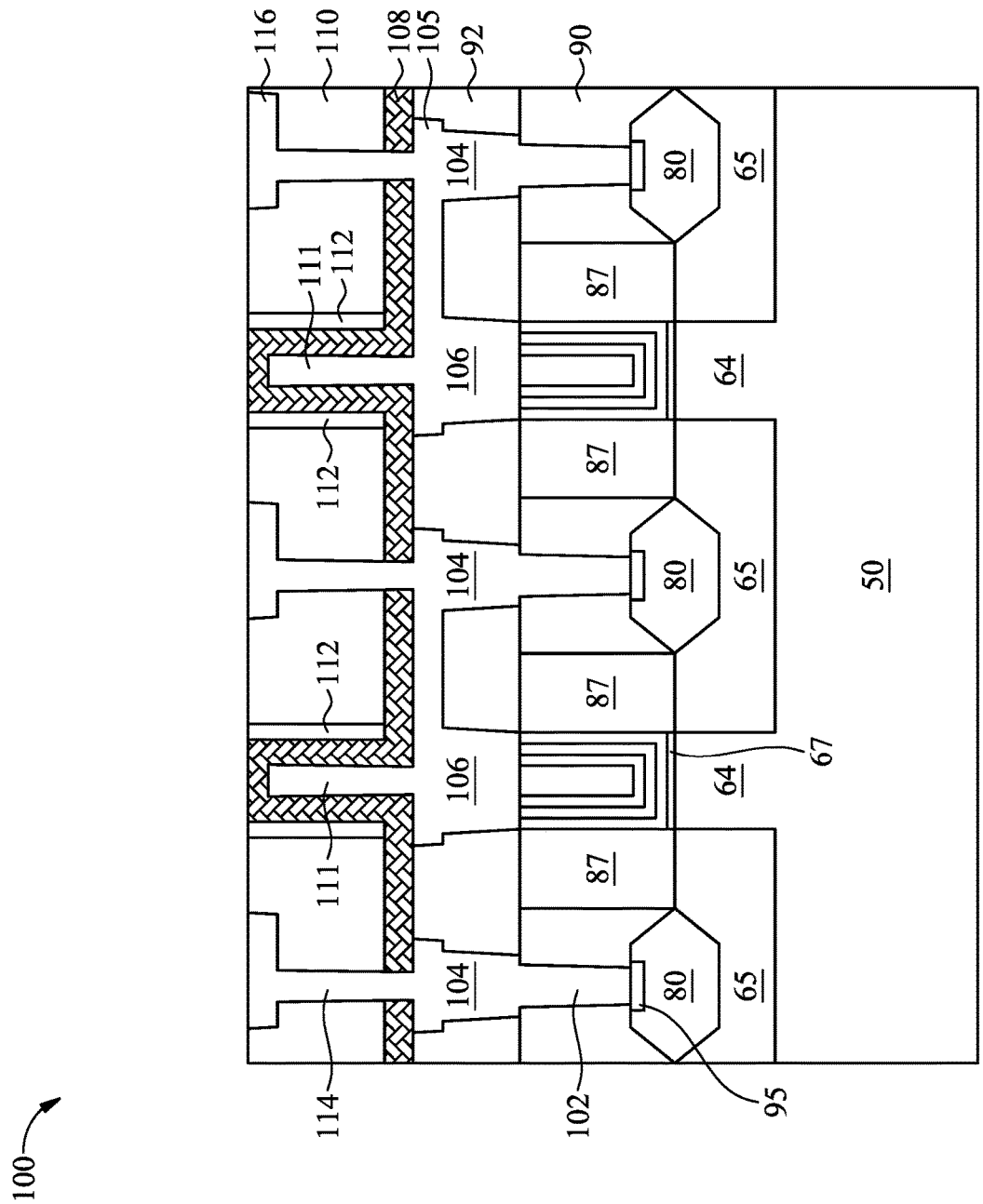

Next, FIG. 14, a dielectric layer 110 is formed over the structure illustrated in FIG. 13, and conductive features (e.g., vias 114 and conductive lines 116) are formed in the dielectric layer 110. The materials and formation methods of the dielectric layer 110 and the conductive features in the dielectric layer 110 may be the same as or similar to those discussed above for the second ILD 92 and the conductive features therein, thus details may not be repeated. As illustrated in FIG. 14, the ferroelectric layer 108, the remaining portions of the top electrode layer 112, the conductive lines 116, and the dielectric layer 110 have a coplanar upper surface. The via 114 extends through the ferroelectric layer 108 to electrically couple to an underlying conductive line 105, in the illustrated embodiment.

Figure 15A:
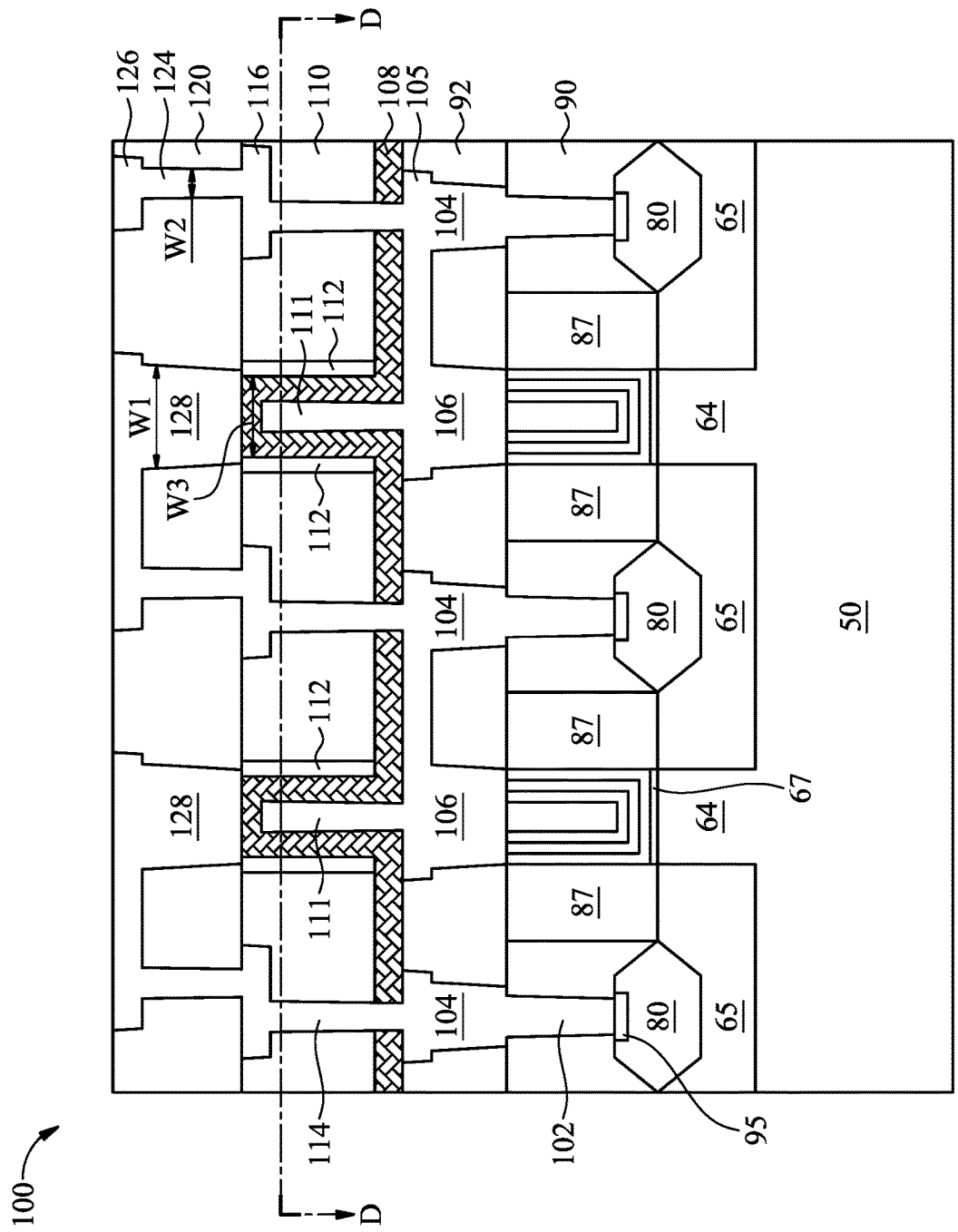

Next, in FIG. 15A, a dielectric layer 120 is formed over the dielectric layer 110, and conductive features (e.g., vias 128/124 and conductive lines 126) are formed in the dielectric layer 120. The materials and formation methods of the dielectric layer 120 and the conductive features in the dielectric layer 120 may be the same as or similar to those discussed above for the second ILD 92 and the conductive features therein, thus details may not be repeated.

In the example of FIG. 15A, each of the vias 128 is electrically coupled to an underlying portion of the ferroelectric layer 108 and the remaining portions of the top electrode layer 112. In other words, a width W1 of the vias 128 is larger than a width W3 of the underlying portion of the ferroelectric layer 108 (measured between exterior sidewalls of the ferroelectric layer 108 facing away from the bottom electrode 111), such that the via 128 connects the remaining portions of the top electrode layer 112 on the opposing exterior sidewalls of the ferroelectric layer 108 to form a top electrode 113 (see FIG. 15E). The top electrode 113 (which includes lower portions of the via 128 and the remaining portions of the top electrode layer 112), the bottom electrode 111, and portions of the ferroelectric layer 108 disposed in between form a three-dimensional ferroelectric capacitor 166 (see FIG. 15E). Therefore, FIG. 15A illustrates two ferroelectric capacitors, each coupled with the metal gate structure of an underlying FinFET to form a 1T-1C FRAM memory cell, thus FIG. 15A shows two 1T-1C FRAM memory cells. In FIG. 15A, the width W1 of the via 128 is also larger than a width W2 of the via 124, which via 124 is electrically coupled to an underlying conductive line 116. In some embodiments, the width W1 is between about 3 times and about 20 times the width W2.

In some embodiments, the ferroelectric layer 108 has two electrical polarization directions, which are used to store the digital value (e.g., 0 or 1) in the FRAM memory cell. For example, when the ferroelectric layer 108 in the 1T-1C FRAM memory cell has a first electrical polarization direction, the FinFET in the 1T-1C memory cell has a first threshold voltage (e.g., 1V). When the ferroelectric layer 108 in the 1T-1C FRAM memory cell has a second electrical polarization direction, the FinFET has a second threshold voltage (e.g., 2V). The difference between the two threshold voltages may be referred to as the threshold voltage shift. A larger threshold voltage shift makes it easier (e.g., less error prone) to read out the digital value stored in the memory cell. For example, when a read voltage (a voltage between the two threshold voltages) is applied to the gate of the FinFET (e.g., applied at the via 128), depending on the polarization direction of the ferroelectric layer 108 (thus the threshold voltage), the FinFET in the 1T-1C memory cell may or may not be turned on, which results in different amount of current flowing through the FinFET. The difference in the current flowing through the FinFET is used to determine the digital value stored in the memory cell. In the example above with two threshold voltages of 1V and 2V, assuming a read voltage of 1.5V is used, a ±0.5V margin is available to tolerate device variations. With the presently disclosed three-dimensional structure for the ferroelectric capacitor in the 1T-1C FRAM memory cell, a larger ratio between the area of the ferroelectric layer 108 in the ferroelectric capacitor and the area of the channel region (e.g., areas of the fin 64 contacted by the metal gate structure 97) of the FinFET is achieved, which increases the threshold voltage shift for the FRAM memory cell formed. For the example above, the two threshold voltages (e.g., 1V and 2V) may become 0.5V and 2.5V, respectively, which allows for a read voltage of 1.5V to be used, with a ±1V margin to tolerate more device variations, thus is more reliable and less error prone.

Figure 15B:
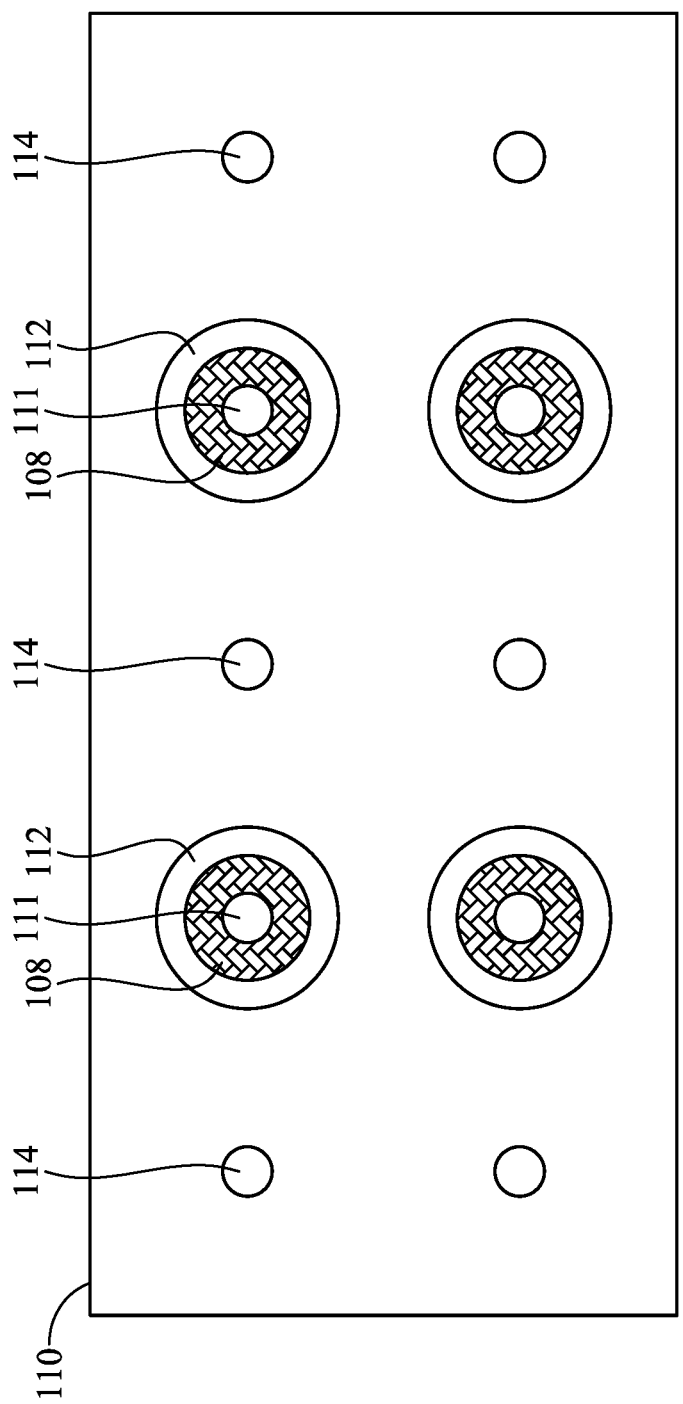
FIGS. 15B-15D illustrate various embodiment cross-sectional views of the FinFET device of FIG. 15A.
Figure 15C:
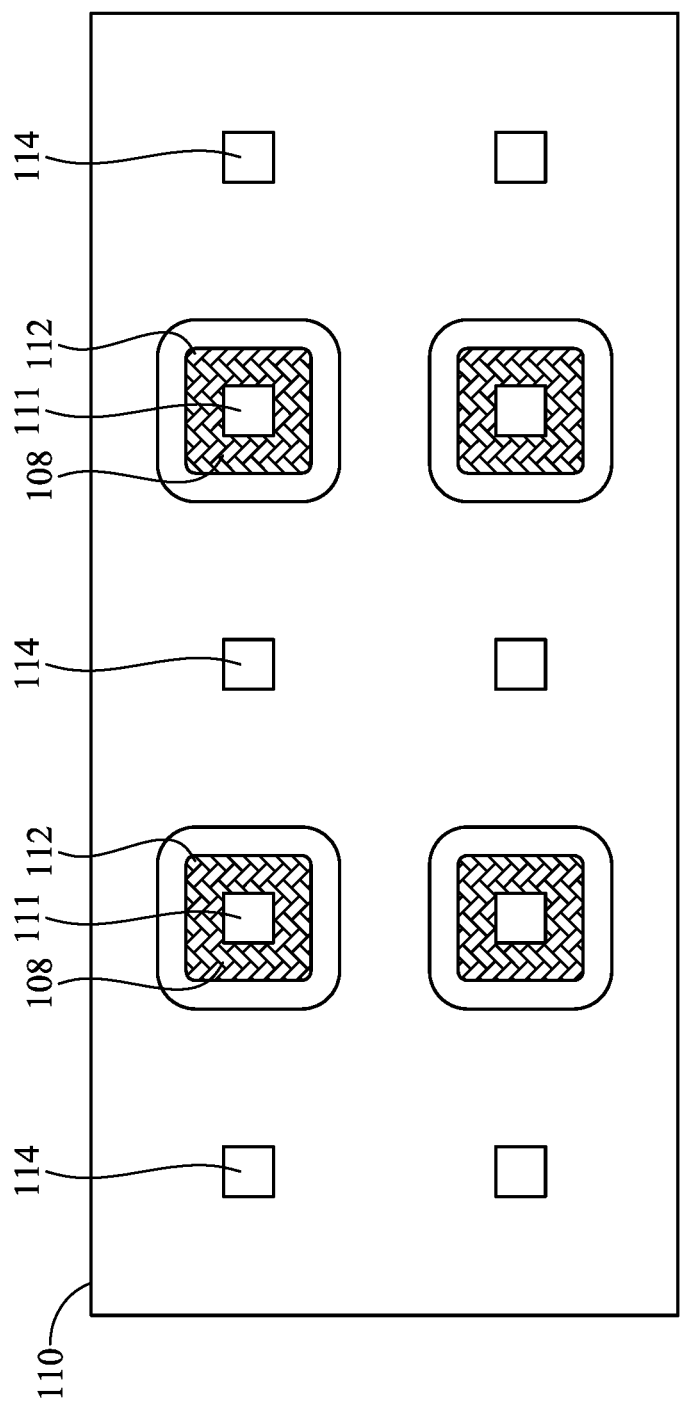
Figure 15D:
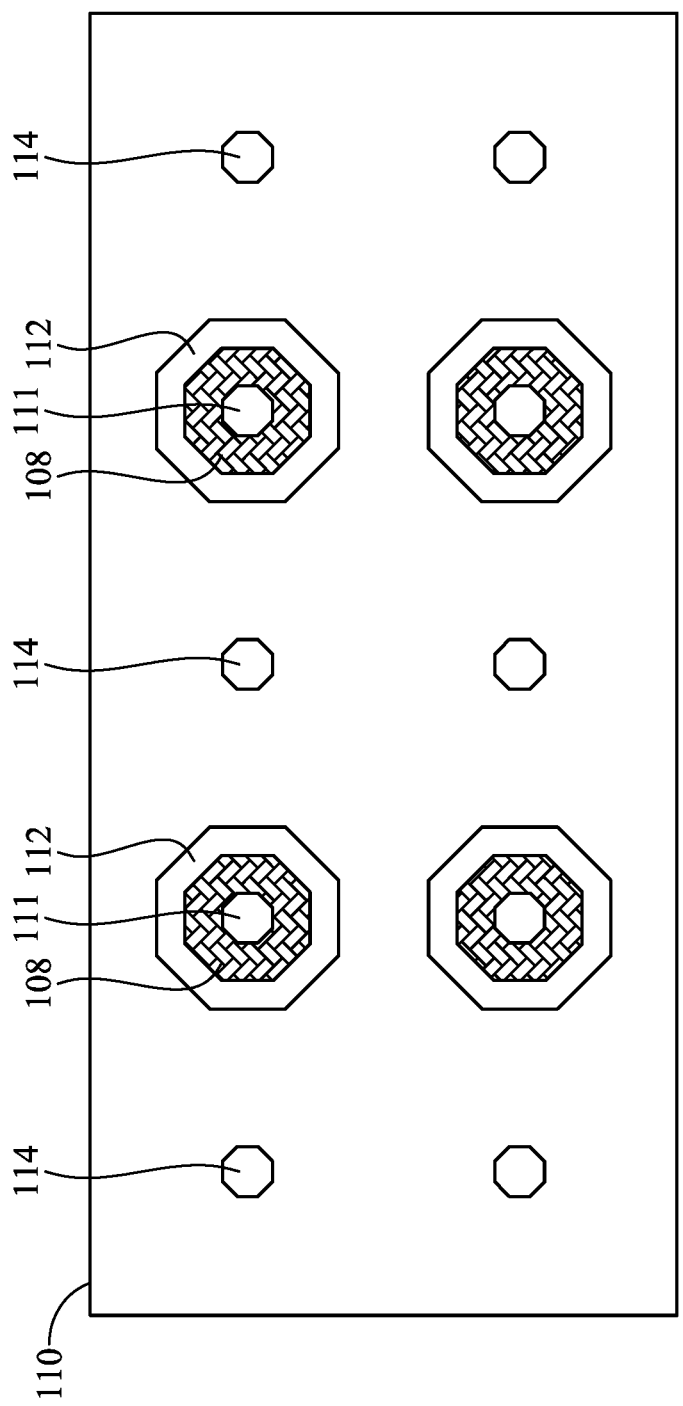

FIGS. 15B-15D illustrate various embodiment cross-sectional views of the FinFET device 100 of FIG. 15A along cross-section D-D in FIG. 15A. In the cross-sectional view of FIG. 15B (e.g., a plan view), the bottom electrode 111 has a circular shaped cross-section. The ferroelectric layer 108 is disposed around the bottom electrode 111 and has an annular shaped cross-section. The remaining portions of the top electrode layer 112 are disposed around the ferroelectric layer 108 and also have an annular shaped cross-section. In addition, the via 114 also has a circular shaped cross-section.

In FIG. 15C, the bottom electrode 111 and the via 114 have rectangular or square shaped cross-sections. Since the ferroelectric layer 108 and the top electrode layer 112 are formed conformally around the bottom electrode 111, the ferroelectric layer 108 and the top electrode layer 112 have hollow rectangular (or hollow square) shaped cross-sections.

In FIG. 15D, the bottom electrode 111 and the via 114 have polygon (e.g., octagon) shaped cross-sections. Since the ferroelectric layer 108 and the top electrode layer 112 are formed conformally around the bottom electrode 111, the ferroelectric layer 108 and the top electrode layer 112 have hollow polygon (e.g., hollow octagon) shaped cross-sections.

The various cross-sections illustrated in FIGS. 15B-15D are merely non-limiting examples, other shapes are also possible and are fully intended to be included within the scope of the present disclosure. In addition, depending on, e.g., the photolithography and etching process used to form the bottom electrode 111, the bottom electrode 111 may have different three-dimensional structures. For example, the three-dimensional shape of the bottom electrode 111 may be a prism, or a frustum.

Figure 15E:
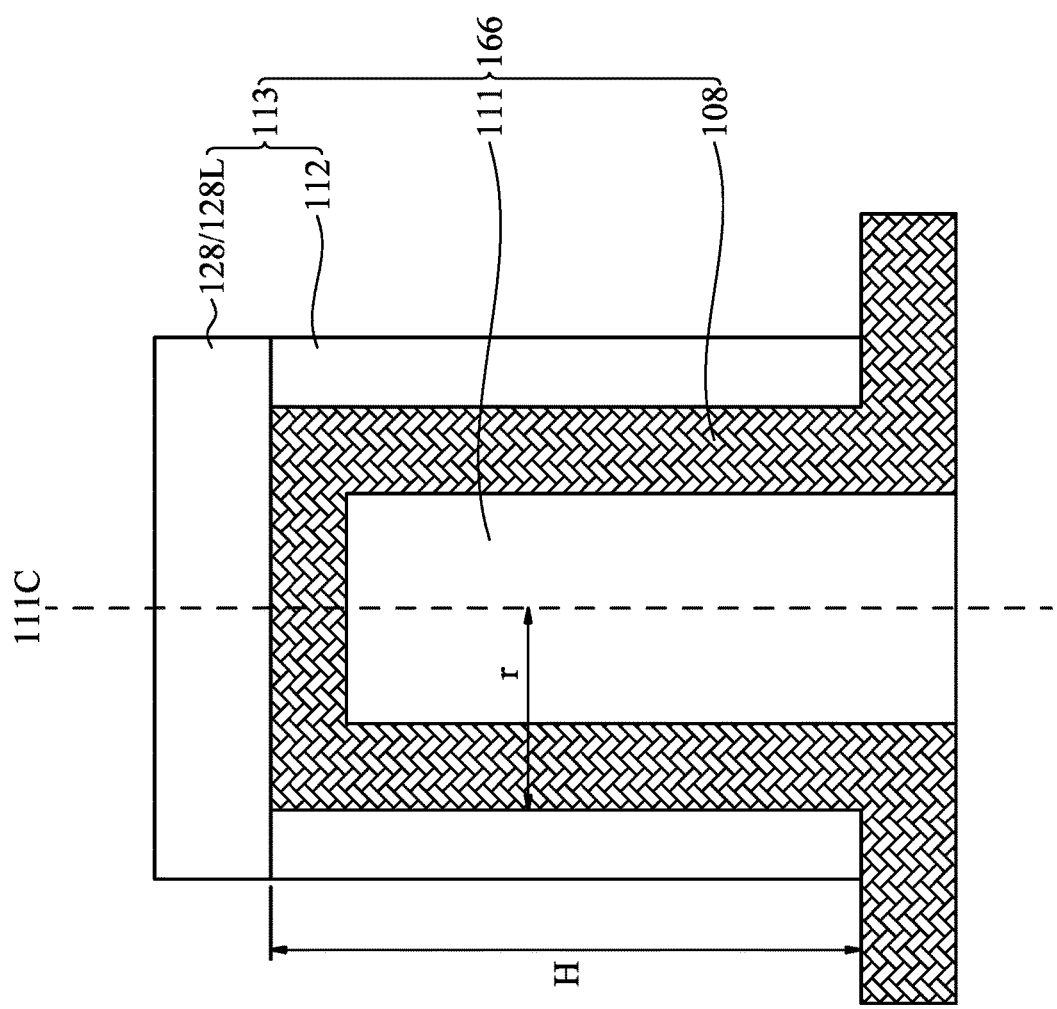
FIG. 15E illustrates a zoomed-in view of a portion of the FinFET device of FIG. 15A.

FIG. 15E illustrates a zoomed-in view of a portion of the FinFET device 100 of FIG. 15A. In particular, FIG. 15E illustrates the three-dimensional ferroelectric capacitor of the FinFET device 100. As illustrated in FIG. 15E, the bottom electrode 111 has a longitudinal center axis 111C. The ferroelectric layer 108 physically contacts and extends along sidewalls and a top surface of the bottom electrode 111. In the example of FIG. 15E, the top electrode 113 of the ferroelectric capacitor includes the remaining portions of the top electrode layer 112 and the lower portion 128L of the via 128. A radius r of the ferroelectric layer 108 may be between about 8 nm and about 30 nm. A height H of the ferroelectric capacitor 166, measured between an upper surface and a lower surface of the remaining portions of the top electrode layer 112, is between about 5 nm and about 200 nm, in some embodiments. The area of the ferroelectric layer 108 in the ferroelectric capacitor 166, which determines the capacitance of the ferroelectric capacitor 166, can be calculated accordingly. For example, assuming a circular cross-section for the bottom electrode 111, the area of the ferroelectric layer 108 in the ferroelectric capacitor 166 is calculated as $\pi r^2 + 2\pi rH$.

Note that by having a three-dimensional structure for the ferroelectric capacitor 166, the capacitance of the ferroelectric capacitor 166 may be adjusted by both the radius r and the height H. In contrast, a planar ferroelectric capacitor, which includes two planar electrodes and a planar ferroelectric layer in between, may only adjust its capacitance by changing the area of the planar electrodes. To obtain a large capacitance, the planar ferroelectric capacitor may require a large electrode area, which may reduce the integration density. The presently disclosed three-dimensional structure for the ferroelectric capacitor (e.g., 166) allows the capacitance to be adjusted in both horizontal direction (e.g., radius r) and vertical direction (e.g., height H), thus allowing large capacitance to be achieved with smaller footprint (or high integration density).

Figure 16:
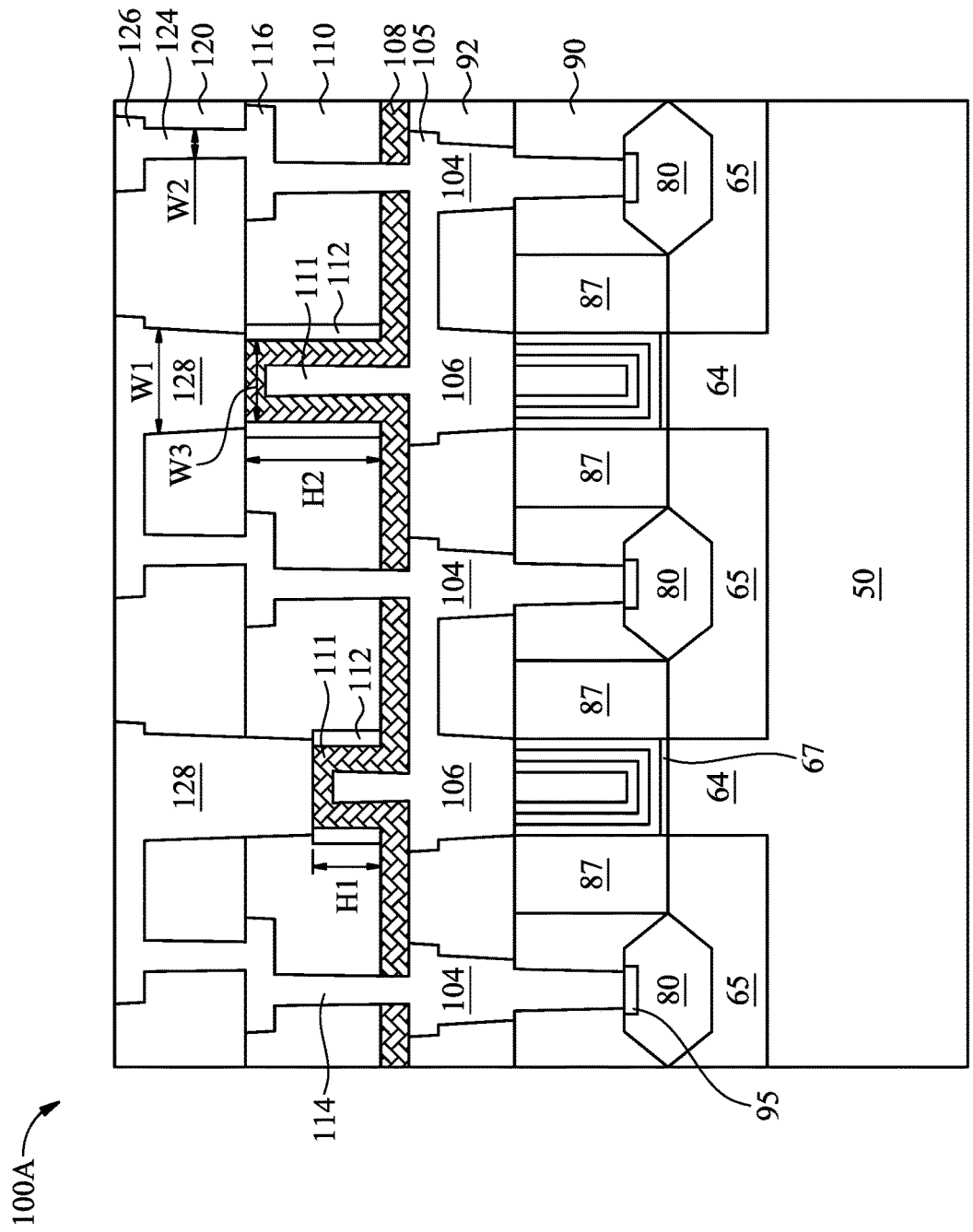
FIG. 16 illustrates a cross-sectional view of a FinFET device, in accordance with another embodiment.

FIG. 16 illustrates a cross-sectional view of a FinFET device 100A, in accordance with another embodiment. The FinFET device 100A is similar to the FinFET device 100 of FIG. 15A, but the two ferroelectric capacitors have different height H1 and H2. This allows ferroelectric capacitors with different capacitance values to be integrated into the FinFET device 100 with little or no negative impact on the integration density of the FinFET device 100. Note that due to the smaller height H1, the via 128 on the left extends into the dielectric layer 110 to electrically couple to the underlying ferroelectric layer 108, while the via 128 on the right contacts the underlying ferroelectric layer 108 at the upper surface of the dielectric layer 110.

FIGS. 17-20 illustrate cross-sectional views of a FinFET device 100B at various stages of fabrication, in accordance with another embodiment. The processing of FIG. 17 follows that of FIG. 12. In other words, FIGS. 2-12 and 17-20 illustrate the fabrication processing steps for the FinFET device 100B.

Figure 17:
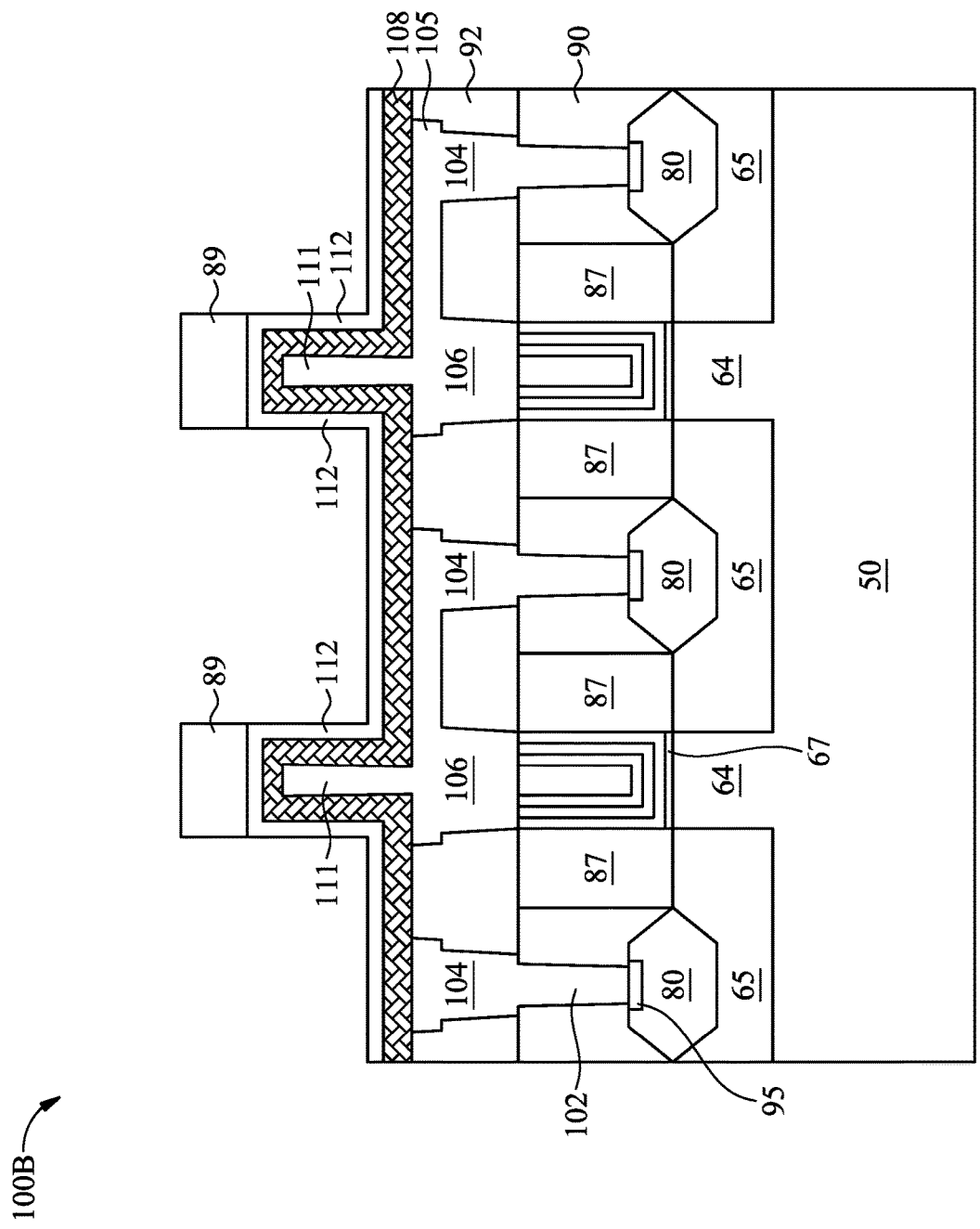
FIGS. 17-20 illustrate cross-sectional views of a FinFET device at various stages of fabrication, in accordance with another embodiment.

Referring to FIG. 17, patterned masks 89 (e.g., patterned photo resist) are formed directly over the bottom electrode 111, such as on portions of the top electrode layer 112 that extend along the top surface of the bottom electrode 111.

Figure 18:
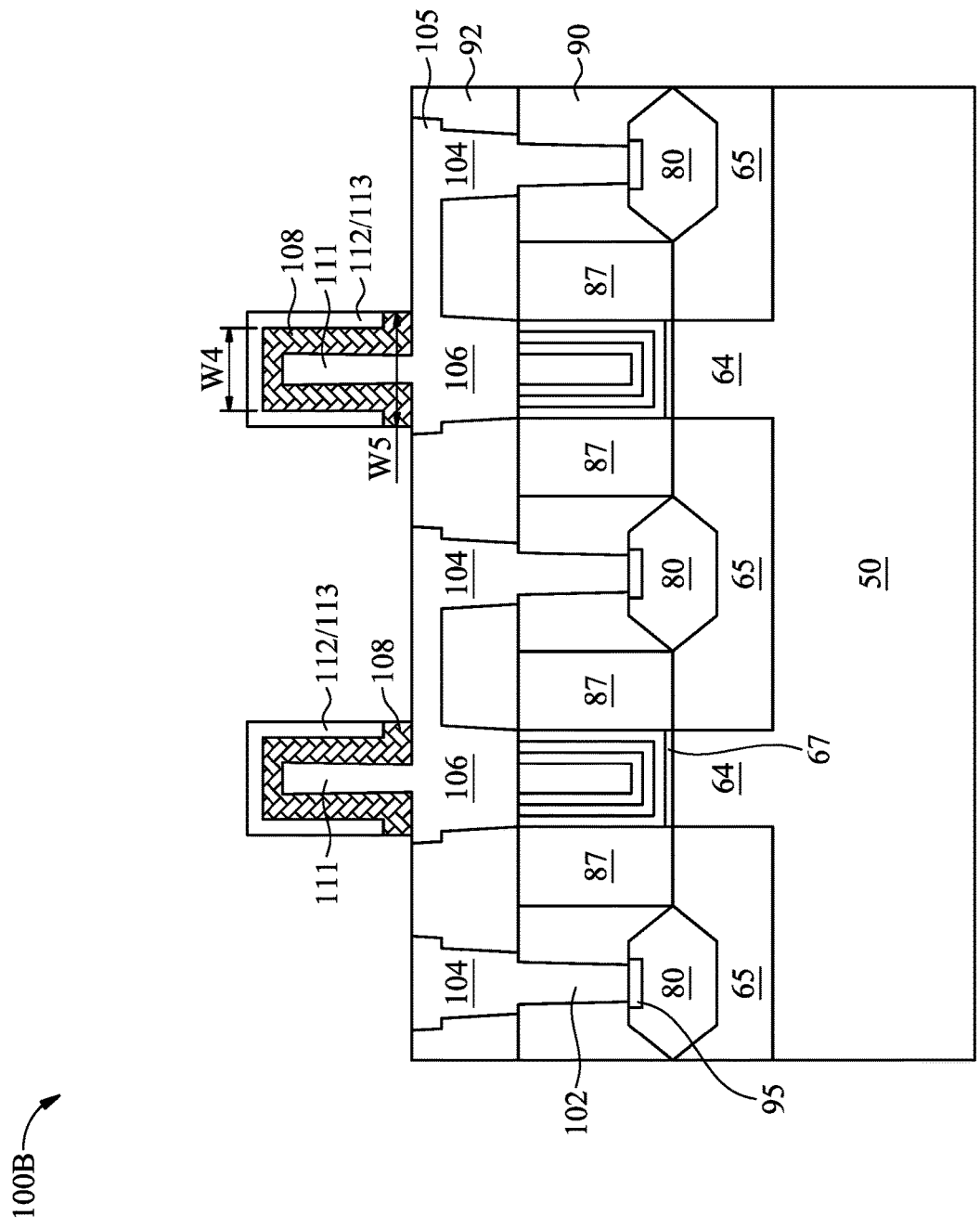

Next, in FIG. 18, an anisotropic etching process, such as a plasma etching process, is performed to remove portions of the ferroelectric layer 108 and portions of the top electrode layer 112 that are disposed beyond the lateral extents of the patterned masks 89 (see FIG. 17). After the anisotropic etching process, the remaining portions of the top electrode layer 112 form the top electrode 113, the second ILD 92 and the conductive lines 105 are exposed. As illustrated in FIG. 18, the top electrode 113 has an inverted U-shape, and extends continuously along an upper surface of (the remaining portions of) the ferroelectric layer 108 from a first sidewall (e.g., the left sidewall in FIG. 18) of the ferroelectric layer 108 to a second opposing sidewall (e.g., the right sidewall in FIG. 18) of the ferroelectric layer 108. Due to the anisotropic etching process, sidewalls of the top electrode 113 are aligned with respective sidewalls of the ferroelectric layer 108.

Note that the ferroelectric layer 108 in FIG. 18 has two different widths. In particular, an upper portion of the ferroelectric layer 108 over the bottom electrode 111 has a width W4, and a lower portion of the ferroelectric layer 108 under the top electrode 113 has a width W5, where W5 is larger than W4. The sidewalls of the lower portion of the ferroelectric layer 108 are aligned with respectively exterior sidewalls of the top electrode 113 facing way from the bottom electrode 111.

Figure 19:
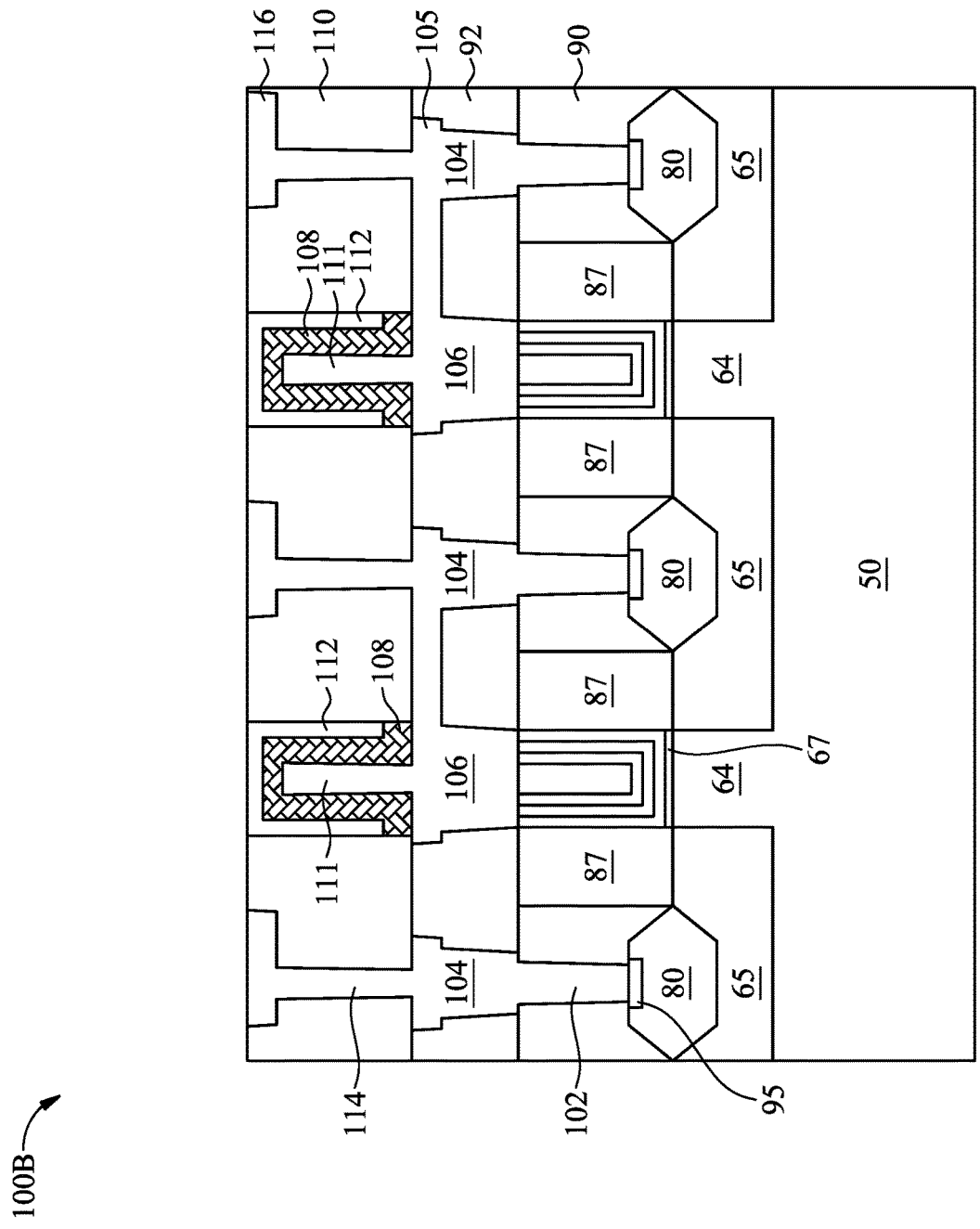

Next, in FIG. 19, the dielectric layer 110 is formed over the second ILD 92, and conductive features, such as vias 114 and conductive lines 116, are formed in the dielectric layer 110. The materials and the formation methods of the dielectric layer 110 and the conductive features 114/116 are the same as or similar to those discussed above with reference to FIG. 14, thus details are not repeated.

Figure 20:
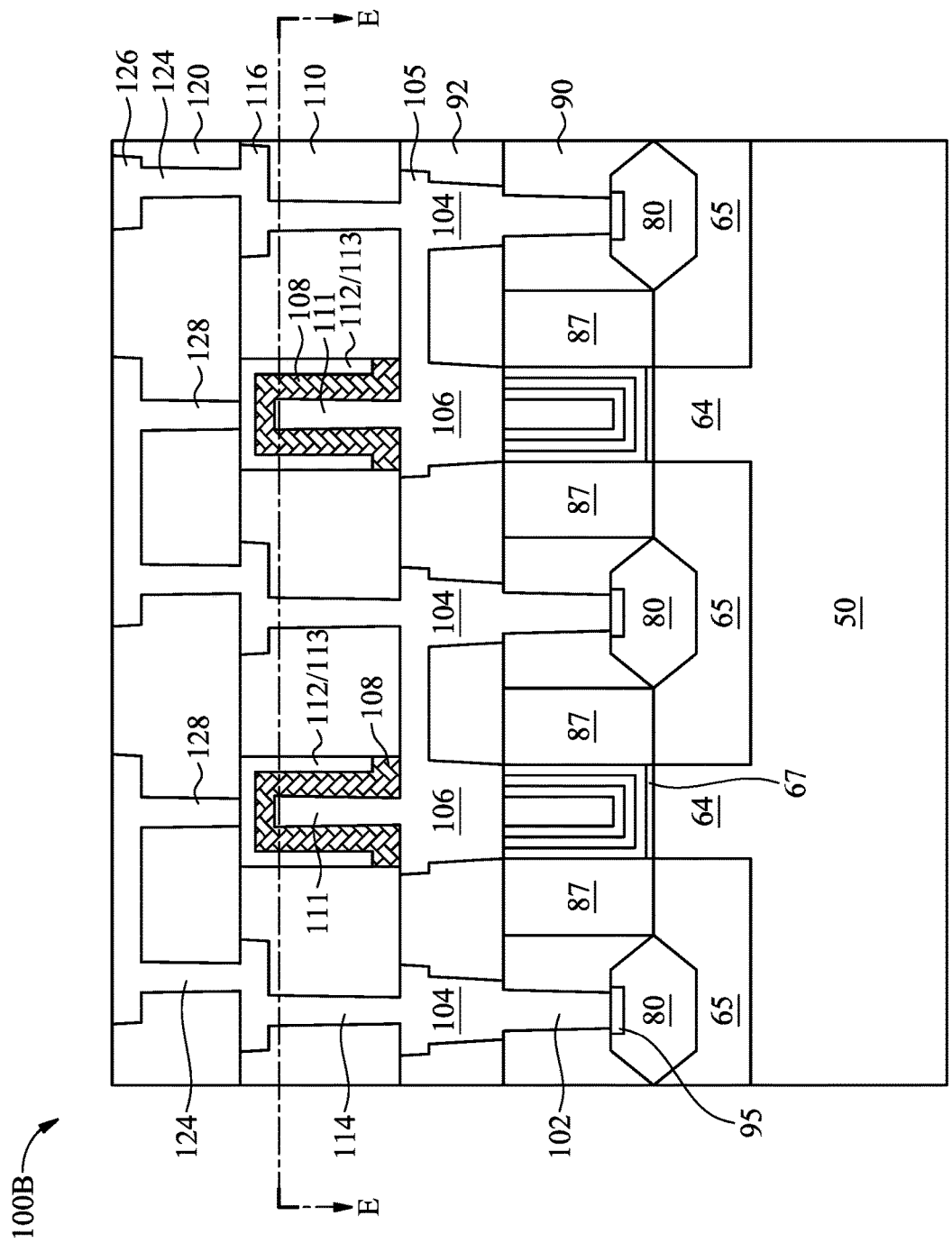

Next, in FIG. 20, the dielectric layer 120 is formed over the dielectric layer 110, and conductive features, such as vias 124 and conductive lines 126, are formed in the dielectric layer 120. The materials and the formation methods of the dielectric layer 120 and the conductive features 124/126 are the same as or similar to those discussed above with reference to FIG. 15A, thus details are not repeated. Note that in the example of FIG. 20, the vias 128 connected to the top electrode 113 and the vias 124 connected to the conductive lines 116 have a same width, while in FIG. 15A, the via 128 connected to the ferroelectric layer 108 is wider than the via 124 connected to the conductive line 116.

Figure 21:
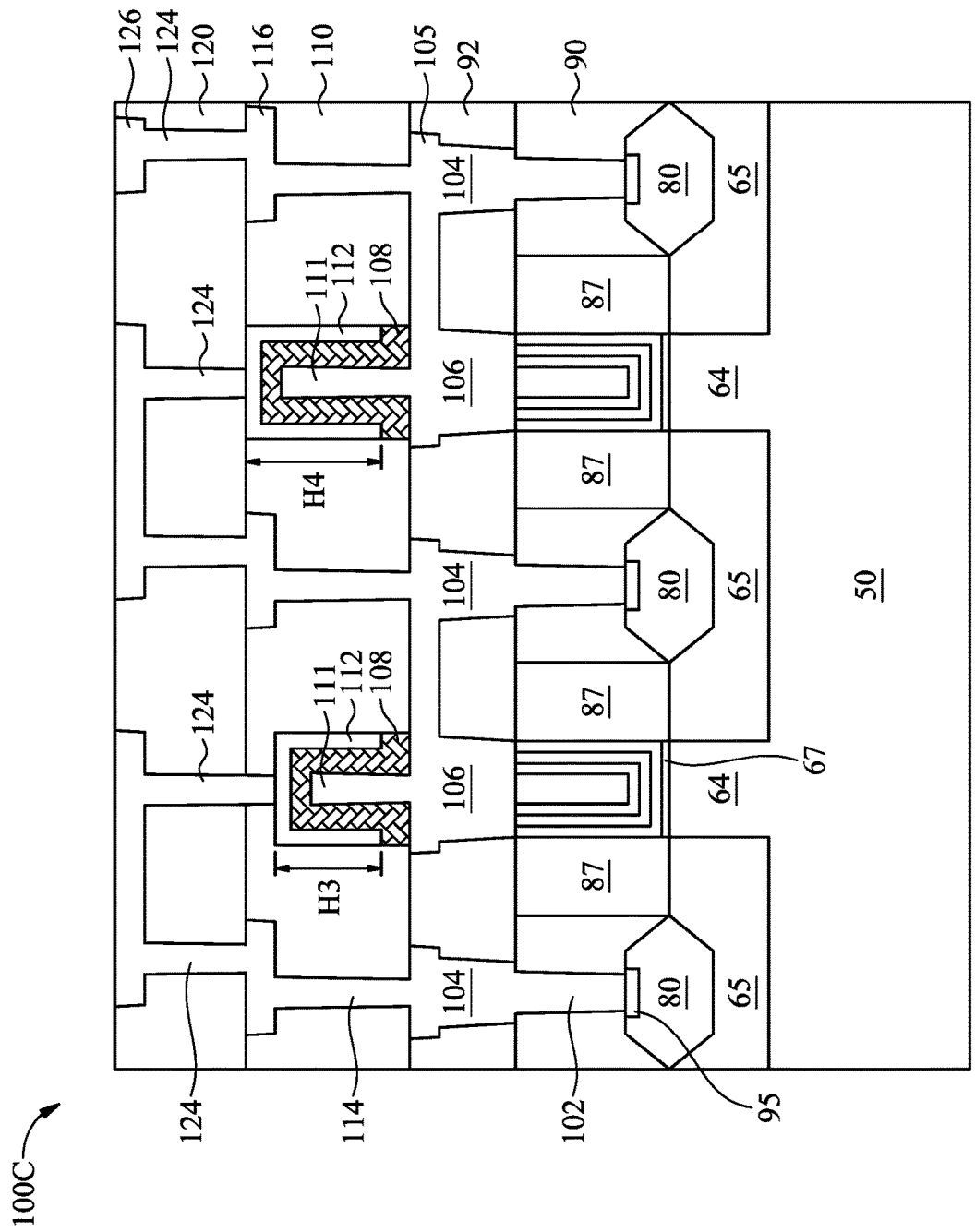
FIG. 21 illustrates a cross-sectional view of a FinFET device, in accordance with yet another embodiment.

FIG. 21 illustrates a cross-sectional view of a FinFET device 100C, in accordance with yet another embodiment. The FinFET device 100C is similar to the FinFET device 100B in FIG. 20, but the two three-dimensional ferroelectric capacitors have different height H3 and H4, respectively, which allows for implementation of ferroelectric capacitors with large, different capacitances with little or no negative impact on integration density.

Figure 22:
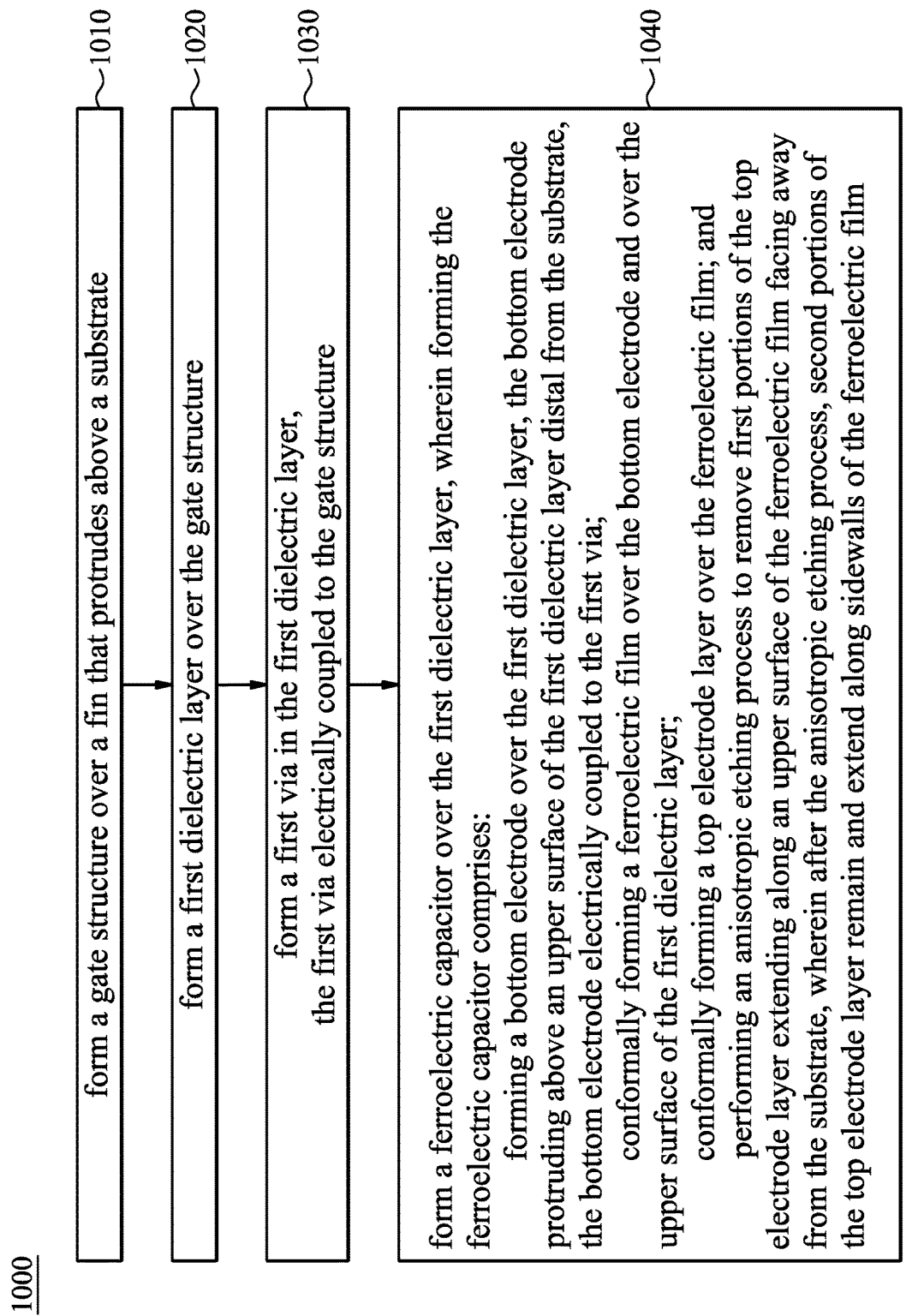
FIG. 22 illustrates a flow chart of method of forming a semiconductor device, in accordance with some embodiments.

FIG. 22 illustrates a flow chart of a method 1000 of forming a semiconductor device, in accordance with some embodiments. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged and repeated.

Referring to FIG. 22, at step 1010, a gate structure is formed over a fin that protrudes above a substrate. At step 1020, a first dielectric layer is formed over the gate structure. At step 1030, a first via is formed in the first dielectric layer, the first via electrically coupled to the gate structure. At step 1040, a ferroelectric capacitor is formed over the first dielectric layer, wherein forming the ferroelectric capacitor comprises: forming a bottom electrode over the first dielectric layer, the bottom electrode protruding above an upper surface of the first dielectric layer distal from the substrate, the bottom electrode electrically coupled to the first via; conformally forming a ferroelectric film over the bottom electrode and over the upper surface of the first dielectric layer; conformally forming a top electrode layer over the ferroelectric film; and performing an anisotropic etching process to remove first portions of the top electrode layer extending along an upper surface of the ferroelectric film facing away from the substrate, wherein after the anisotropic etching process, second portions of the top electrode layer remain and extend along sidewalls of the ferroelectric film.

Embodiments may achieve advantages. For example, the disclosed three-dimensional structure of the ferroelectric capacitor allows for flexible tuning of the capacitance along both horizontal direction (e.g., through adjustment of radius r) and vertical direction (e.g., through adjustment of height H). The disclosed structure allows large capacitance to be achieved without increasing the footprint of the integrated ferroelectric capacitor, thereby allowing a wide memory design window with little or no penalty for integration density. The disclosed three-dimensional structure for the ferroelectric capacitor increases the threshold voltage shift, thus making the read operation of the memory cell easier and less error prone. In addition, the disclosed fabrication process for the ferroelectric capacitor can be easily integrated into exiting CMOS processing flow for fabrication of FRAM memory devices.

In accordance with an embodiment, a semiconductor device includes: a substrate; a fin protruding over the substrate; a gate structure over the fin; a bottom electrode over and electrically coupled to the gate structure; a ferroelectric layer around the bottom electrode; and a top electrode around the ferroelectric layer. In an embodiment, the bottom electrode has a longitudinal axis perpendicular to a major upper surface of the substrate. In an embodiment, the ferroelectric layer contacts and extends along sidewalls of the bottom electrode and an upper surface of the bottom electrode. In an embodiment, the top electrode contacts and extends along sidewalls of the ferroelectric layer. In an embodiment, the top electrode further contacts and extends along an upper surface of the ferroelectric layer. In an embodiment, a first width measured between exterior sidewalls of the top electrode facing away from the bottom electrode is a same as a second width measured between exterior sidewalls of the ferroelectric layer facing away from the bottom electrode. In an embodiment, the top electrode comprises a first electrically conductive material that extends along the sidewalls of the ferroelectric layer, and comprises a second electrically conductive material that extends along the upper surface of the ferroelectric layer, wherein the first electrically conductive material is different from the second electrically conductive material. In an embodiment, the bottom electrode and the ferroelectric layer are disposed in a first dielectric layer over the fin, wherein the semiconductor device further comprises: a second dielectric layer over the first dielectric layer; a first via in the second dielectric layer and physically contacting the ferroelectric layer; and a second via in the second dielectric layer adjacent to the first via, wherein a width of the first via is larger than a width of the second via. In an embodiment, the first via comprises the second electrically conductive material. In an embodiment, the width of the first via is between about three times and about twenty times the width of the second via.

In accordance with an embodiment, a semiconductor device includes: a fin protruding above a substrate; a first gate structure over the fin; and a first ferroelectric capacitor over and electrically coupled to the first gate structure, wherein the first ferroelectric capacitor comprises: a first bottom electrode over and electrically coupled to the first gate structure; a first ferroelectric film surrounding the first bottom electrode, wherein the first ferroelectric film extends along sidewalls and a top surface of the first bottom electrode; and a first top electrode surrounding the first ferroelectric film. In an embodiment, the semiconductor device further includes: a first dielectric layer over the first gate structure, wherein the first dielectric layer is between the first gate structure and the first ferroelectric capacitor; and a first electrically conductive feature in the first dielectric layer that electrically couples the first gate structure and the first bottom electrode. In an embodiment, the first ferroelectric film extends along an upper surface of the first dielectric layer beyond exterior sidewalls of the first top electrode that face away from the first bottom electrode. In an embodiment, the first top electrode comprises a first material that extends continuously along sidewalls of the first ferroelectric film and along an upper surface of the first ferroelectric film. In an embodiment, a material of the first top electrode is different from a material of the first bottom electrode. In an embodiment, the semiconductor device further includes: a second gate structure over the fin; and a second ferroelectric capacitor over and electrically coupled to the second gate structure, wherein the second ferroelectric capacitor comprises: a second bottom electrode over and electrically coupled to the second gate structure, wherein a first height of the first bottom electrode is larger than a second height of the second bottom electrode, wherein the first height and the second height are measured along a first direction perpendicular to a major upper surface of the substrate; a second ferroelectric film surrounding the second bottom electrode, wherein the second ferroelectric film extends along sidewalls and a top surface of the second bottom electrode; and a second top electrode surrounding the second ferroelectric film.

In accordance with an embodiment, a method of forming a semiconductor device includes: forming a gate structure over a fin that protrudes above a substrate; forming a first dielectric layer over the gate structure; forming a first via in the first dielectric layer, the first via electrically coupled to the gate structure; and forming a ferroelectric capacitor over the first dielectric layer, wherein forming the ferroelectric capacitor comprises: forming a bottom electrode over the first dielectric layer, the bottom electrode protruding above an upper surface of the first dielectric layer distal from the substrate, the bottom electrode electrically coupled to the first via; conformally forming a ferroelectric film over the bottom electrode and over the upper surface of the first dielectric layer; conformally forming a top electrode layer over the ferroelectric film; and performing an anisotropic etching process to remove first portions of the top electrode layer extending along an upper surface of the ferroelectric film facing away from the substrate, wherein after the anisotropic etching process, second portions of the top electrode layer remain and extend along sidewalls of the ferroelectric film. In an embodiment, forming the bottom electrode comprises: forming a dummy dielectric layer over the first dielectric layer; forming the bottom electrode in the dummy dielectric layer; and removing the dummy dielectric layer after forming the bottom electrode. In an embodiment, after the anisotropic etching process, the ferroelectric film extends along the upper surface of the first dielectric layer beyond exterior sidewalls of the second portions of the top electrode layer facing away from the bottom electrode. In an embodiment, the method further includes: before performing the anisotropic etching process, forming a patterned mask on the top electrode layer directly over the bottom electrode, wherein the anisotropic etching process further removes portions of the ferroelectric film that extend beyond lateral extents of the patterned mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a transistor over a substrate;
    forming a first dielectric layer over the transistor;
    forming a first via in the first dielectric layer, the first via electrically coupled to the transistor; and
    forming a ferroelectric capacitor over the first dielectric layer, wherein forming the ferroelectric capacitor comprises:
        forming a bottom electrode over the first dielectric layer, the bottom electrode protruding above an upper surface of the first dielectric layer distal from the substrate, the bottom electrode electrically coupled to the first via;
        forming a ferroelectric film over the bottom electrode and over the first dielectric layer;
        forming a top electrode layer over the ferroelectric film; and
        removing first portions of the top electrode layer from an upper surface of the ferroelectric film facing away from the substrate, wherein after the removing, second portions of the top electrode layer remain and extend along sidewalls of the ferroelectric film.

2. The method of claim 1, wherein removing the first portions of the top electrode layer comprises performing an anisotropic etching process to remove the first portions of the top electrode layer.

3. The method of claim 2, wherein after removing the first portions of the top electrode layer, the upper surface of the ferroelectric film is exposed by the top electrode layer.

4. The method of claim 3, wherein after removing the first portions of the top electrode layer, the ferroelectric film extends along the upper surface of the first dielectric layer, and extends laterally further from the bottom electrode than the second portions of the top electrode layer.

5. The method of claim 3, further comprising, after removing the first portions of the top electrode layer:
    forming a via over and contacting the upper surface of the ferroelectric film.

6. The method of claim 5, wherein the via is formed of a material different from that of the top electrode layer.

7. The method of claim 2, further comprising, after forming the top electrode layer and before removing the first portions of the top electrode layer:
    forming a patterned mask layer over the top electrode layer and over the bottom electrode, wherein the anisotropic etching process is performed using the patterned mask layer as an etching mask.

8. The method of claim 7, wherein a first width of the patterned mask layer, measured between opposing sidewalls of the patterned mask layer, is formed to be the same as a second width of the top electrode layer measured between opposing sidewalls of the top electrode layer.

9. The method of claim 1, wherein forming the bottom electrode comprises:
    forming a dummy dielectric layer over the first dielectric layer;
    forming a conductive pillar in the dummy dielectric layer; and
    removing the dummy dielectric layer after forming the conductive pillar, wherein the conductive pillar becomes the bottom electrode after removing the dummy dielectric layer.

10. The method of claim 9, wherein the conductive pillar has a polygon-shaped cross-section.

11. A method of forming a semiconductor device, the method comprising:
    forming a transistor over a substrate;
    forming a first dielectric layer over the transistor;
    forming a first via in the first dielectric layer, the first via electrically coupled to the transistor;
    forming a dummy dielectric layer over the first dielectric layer;
    forming a conductive pillar in the dummy dielectric layer;
    removing the dummy dielectric layer to expose the conductive pillar;
    after removing the dummy dielectric layer, forming a ferroelectric layer along sidewalls of the conductive pillar and along a top surface of the conductive pillar;
    forming a top electrode layer over the ferroelectric layer; and
    performing an anisotropic etching process to remove first portions of the top electrode layer from an upper surface of the ferroelectric layer facing away from the substrate, wherein after the anisotropic etching process, second portions of the top electrode layer remain and extend along sidewalls of the conductive pillar.

12. The method of claim 11, further comprising, after the anisotropic etching process:
    forming a second dielectric layer over the first dielectric layer around the conductive pillar;
    forming a third dielectric layer over the second dielectric layer; and
    forming a second via in the third dielectric layer, wherein the second via is over and electrically coupled to the second portions of the top electrode layer.

13. The method of claim 12, further comprising:
    forming a third via in the second dielectric layer laterally adjacent to the conductive pillar; and
    forming a fourth via in the third dielectric layer, wherein the fourth via is over and electrically coupled to the third via, wherein the second via is formed to be wider than the fourth via.

14. The method of claim 11, wherein after the anisotropic etching process, the ferroelectric layer extends along an upper surface of the first dielectric layer beyond exterior sidewalls of the second portions of the top electrode layer facing away from the conductive pillar.

15. The method of claim 11, further comprising, after forming the top electrode layer and before performing the anisotropic etching process, forming a patterned mask on the top electrode layer directly over the conductive pillar, wherein the anisotropic etching process further removes portions of the ferroelectric layer that extend beyond lateral extents of the patterned mask.

16. A semiconductor device comprising:
a transistor over a substrate;
a first dielectric layer over the transistor;
a bottom electrode protruding above an upper surface of the first dielectric layer distal from the substrate;
a ferroelectric layer around the bottom electrode, wherein the ferroelectric layer contacts and extends along sidewalls of the bottom electrode and along an upper surface of the bottom electrode distal from the substrate; and
a top electrode around the ferroelectric layer, wherein the top electrode comprises a first electrically conductive material that contacts and extends along sidewalls of the ferroelectric layer, and comprises a second electrically conductive material that contacts and extends along an upper surface of the ferroelectric layer distal from the substrate, wherein the first electrically conductive material and the second electrically conductive material are different materials.

17. The semiconductor device of claim 16, further comprising:
a second dielectric layer over the first dielectric layer and around the bottom electrode, wherein an upper surface of the second dielectric layer distal from the substrate is level with the upper surface of the ferroelectric layer.

18. The semiconductor device of claim 17, further comprising:
a third dielectric layer over the second dielectric layer; and
a via in the third dielectric layer, wherein the via is over and electrically coupled to the top electrode.

19. The semiconductor device of claim 18, wherein the via physically contacts the ferroelectric layer and the top electrode.

20. The semiconductor device of claim 16, further comprising:
a second dielectric layer over the first dielectric layer and around the bottom electrode, wherein an upper surface of the second dielectric layer distal from the substrate is further from the substrate than an upper surface of the top electrode distal from the substrate.

* * * * *